(12) United States Patent
Lee et al.

(10) Patent No.: US 12,444,641 B2
(45) Date of Patent: Oct. 14, 2025

(54) TRAVEL ROBOT FOR MOVING SUBSTRATE TRANSFER ROBOT IN VACUUM CHAMBER

(71) Applicant: T-Robotics Co., Ltd., Osan-si (KR)

(72) Inventors: Soo Jong Lee, Suwon-si (KR); Myung Jin Kim, Pyeongtaek-si (KR); Chang Seong Lee, Hwaseong-si (KR); Seung Young Baek, Osan-si (KR); Chang Hyun Jee, Anyang-si (KR); Sang Hwi Ham, Gunpo-si (KR); Moon Gi Hur, Suwon-si (KR); Jae Hyun Park, Osan-si (KR); Tae Han Lee, Yangju-si (KR)

(73) Assignee: T-Robotics Co., Ltd., Osan-si (KR)

( * ) Notice: Subject to any disclaimer, the term of this patent is extended or adjusted under 35 U.S.C. 154(b) by 826 days.

(21) Appl. No.: 17/723,187

(22) Filed: Apr. 18, 2022

(65) Prior Publication Data
US 2022/0410944 A1    Dec. 29, 2022

(30) Foreign Application Priority Data
Jun. 25, 2021    (KR) .......................... 10-2021-0083274

(51) Int. Cl.
*H01L 21/687*    (2006.01)
*B61B 12/00*    (2006.01)
(Continued)

(52) U.S. Cl.
CPC ........ *H01L 21/68707* (2013.01); *B61B 12/00* (2013.01); *B61B 13/00* (2013.01);
(Continued)

(58) Field of Classification Search
CPC ... B61B 12/00; B61B 13/00; H01L 21/68707; H01L 21/67167; H01L 21/67173; H01L 21/67742
See application file for complete search history.

(56) References Cited

U.S. PATENT DOCUMENTS 5,605,487 A * 2/1997 Hileman ........... H01L 21/68707
                                                                451/41
6,085,670 A * 7/2000 Genov .................... B23Q 1/48
                                                              248/188.4
(Continued)

FOREIGN PATENT DOCUMENTS

CN      115483126      12/2016

*Primary Examiner* — Saul Rodriguez
*Assistant Examiner* — Ashley K Romano
(74) *Attorney, Agent, or Firm* — David R. Stevens; Stevens Law Group

(57) ABSTRACT

A travel robot for moving a substrate transfer robot in a vacuum chamber, includes: a travel arm platform through which coupling holes are formed, wherein an elevating drive shaft is inserted into a lower space of one of the coupling holes; a first travel arm part including a (1_1)-st and a (1_2)-nd travel link arms; a second travel arm part including a (2_1)-st and a (2_2)-nd travel link arms, wherein travel driving motors and speed reducers are installed in the (1_1)-st and the (2_1)-st travel link arms; and a transfer robot coupling part engaged with the (1_2)-nd and the (2_2)-nd travel link arms, wherein a rotation driving motor built thereon is engaged with the substrate transfer robot by a rotation drive shaft.

13 Claims, 19 Drawing Sheets

(51) Int. Cl.
*B61B 13/00* (2006.01)
*H01L 21/67* (2006.01)
*H01L 21/677* (2006.01)

(52) U.S. Cl.
CPC .. *H01L 21/67167* (2013.01); *H01L 21/67173* (2013.01); *H01L 21/67742* (2013.01)

(56) References Cited

U.S. PATENT DOCUMENTS

| | | | |
|---|---|---|---|
| 12,080,586 B2 * | 9/2024 | Lee | H01L 21/68707 |
| 2010/0209220 A1 * | 8/2010 | Wagner | H01L 21/67766 |
| | | | 901/46 |
| 2012/0201641 A1 * | 8/2012 | Matsuzaki | H01L 21/67766 |
| | | | 414/744.3 |
| 2013/0147437 A1 * | 6/2013 | Yamada | H01L 21/67259 |
| | | | 320/128 |

* cited by examiner

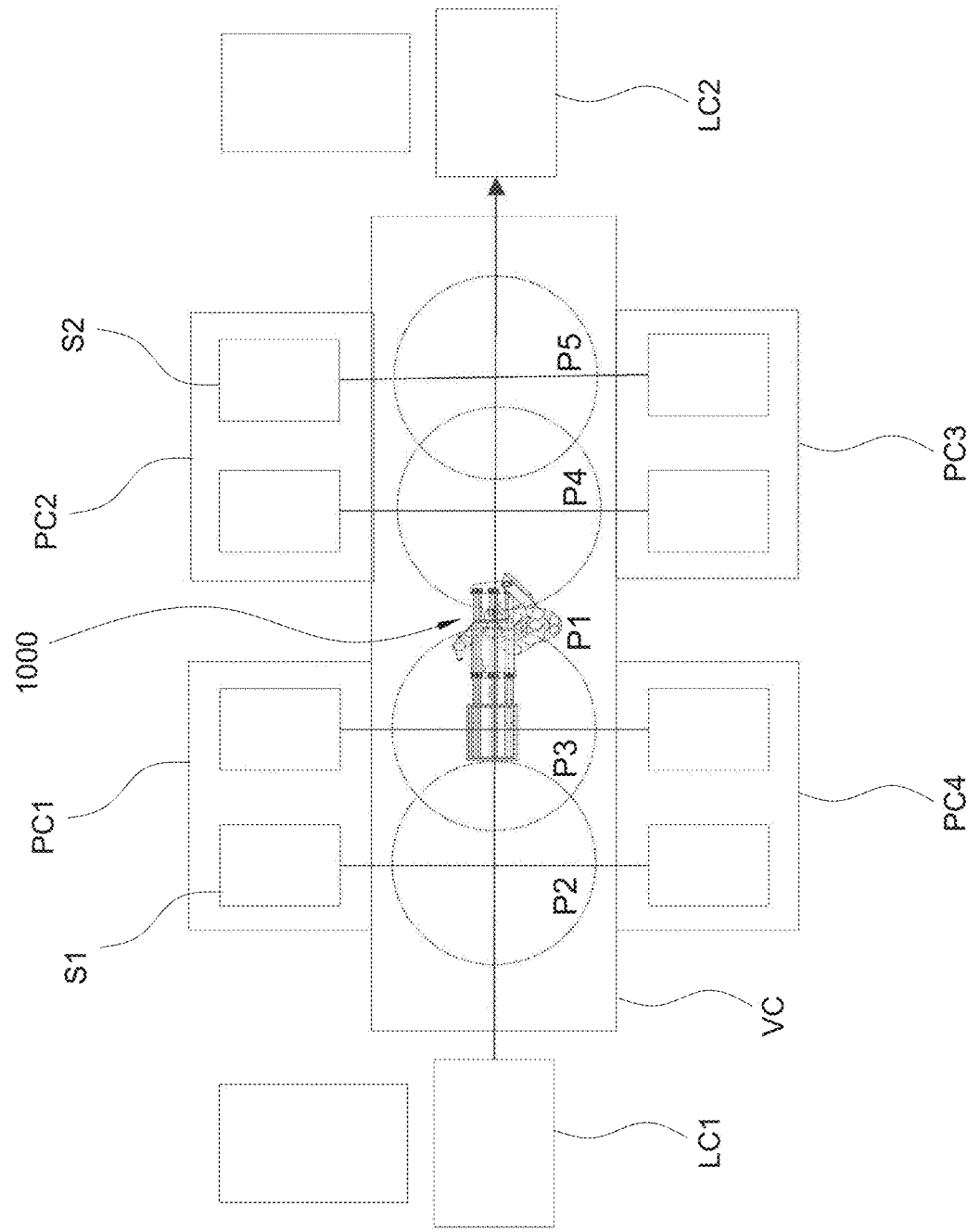

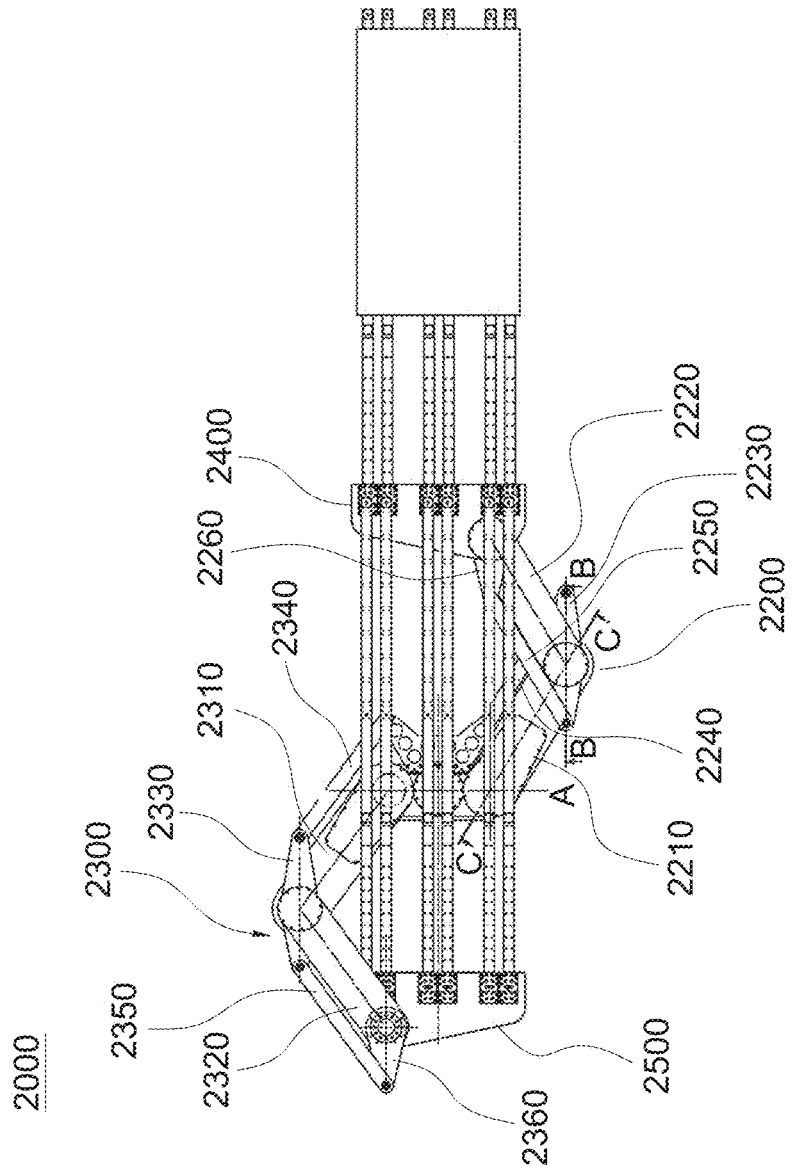

SECTION A-A

SECTION B-B

SECTION C-C

TRAVEL ROBOT FOR MOVING SUBSTRATE TRANSFER ROBOT IN VACUUM CHAMBER

CROSS REFERENCE OF RELATED APPLICATION

This present application claims the benefit of the earlier filing date of Korean non-provisional patent application No. 10-2021-0083274, filed Jun. 25, 2021, the entire contents of which being incorporated herein by reference.

FIELD OF THE DISCLOSURE

The present disclosure relates to a travel robot; and more particularly, to the travel robot that moves a substrate transfer robot within a vacuum chamber of a substrate processing equipment, wherein the substrate transfer robot is used for transferring substrates inside the vacuum chamber.

BACKGROUND OF THE DISCLOSURE

In general, a substrate such as a wafer for a semiconductor device, a glass substrate for a display device, or a glass substrate for a thin film solar cell is manufactured by performing various processes on the substrate. During these processes, the substrate is loaded and processed in a substrate processing equipment that provides optimal conditions for each of the processes.

Nowadays, in order to improve productivity, a cluster-type substrate processing equipment capable of collectively processing the substrate is being developed and used.

The cluster-type substrate processing equipment includes a load lock chamber for storing the substrate, a transfer chamber for transferring the substrate, and a plurality of process chambers for performing each manufacturing process.

Additionally, a substrate transfer robot, installed in the transfer chamber that is in a vacuum state, may transfer the substrate back and forth between the transfer chamber and the load lock chamber, among multiple transfer chambers, or in and out of the process chambers.

Recently, in order to cope with a large size of the substrate and to improve a substrate processing capability, various researches are in progress to change a structure that processes two substrates in one process chamber or an octagonal structure in which four process chambers are installed at equal distances around the transfer chamber to a tetragonal structure having the processing chambers installed on both sides of a transfer path of the transfer chamber.

Especially, in order to deal with an offset distance between respective locations of the two substrates in a structure where they are positioned within one process chamber or in order to account for install locations of each of the process chambers in the tetragonal structure, shifting of a position of the substrate transfer robot is inevitably required.

To this end, a method such as installing rails and the like as the transport path within the transfer chamber and moving the substrate transfer robot along the transport path is being suggested.

However, since the installment of the transport path such as the rails within the transfer chamber requires additional structures for forming the transport path within the transfer chamber first in prior to installing the substrate transfer robot on top of the additional structures, it is expected that not only the installment of the substrate transfer robot but also subsequent maintenance of the substrate transfer robot are highly complicated.

PRIOR ART LITERATURE (Patent Document 0001) Korean Patent Publication No. 10-2019-0072373 A
(Patent Document 0002) Korean Patent Publication No. 10-2012-0024021 A

SUMMARY OF THE DISCLOSURE

It is an object of the present disclosure to solve all the aforementioned problems.

It is another object of the present disclosure to provide a travel robot capable of moving a substrate transfer robot in a vacuum chamber.

It is still another object of the present disclosure to facilitate easy installation of the travel robot for moving the substrate transfer robot in the vacuum chamber.

It is still yet another object of the present disclosure to facilitate easy maintenance of the travel robot for moving the substrate transfer robot installed in the vacuum chamber.

It is still yet another object of the present disclosure to provide the travel robot capable of moving the substrate transfer robot while maintaining a vacuum state in the vacuum chamber.

In accordance with one aspect of the present disclosure, there is provided a travel robot for moving a substrate transfer robot in a vacuum chamber, comprising: a travel arm platform through which a $(1\_1)$-st coupling hole, a $(1\_2)$-nd coupling hole and a $(1\_3)$-rd coupling hole are formed respectively at a first center area, a first one-end area and a first opposite-end area thereof, wherein a $(1\_1)$-st locking member, through which a $(1\_1)$-st through-hole corresponding to a hollow of an elevating drive shaft is formed, compartmentalizes the $(1\_1)$-st coupling hole into a $(1\_1)$-st upper space sealed by a $(1\_1)$-st cover and a $(1\_1)$-st lower space, wherein a $(1\_2)$-nd locking member, through which a $(1\_2)$-nd through-hole is formed, compartmentalizes the $(1\_2)$-nd coupling hole into a $(1\_2)$-nd upper space and a $(1\_2)$-nd lower space sealed by a $(1\_2)$-nd cover, wherein a $(1\_3)$-rd locking member, through which a $(1\_3)$-rd through-hole is formed, compartmentalizes the $(1\_3)$-rd coupling hole into a $(1\_3)$-rd upper space and a $(1\_3)$-rd lower space sealed by a $(1\_3)$-rd cover, and wherein the elevating drive shaft inserted into the $(1\_1)$-st lower space is fixedly engaged with the $(1\_1)$-st locking member; a first travel arm part including a $(1\_1)$-st travel link arm and a $(1\_2)$-nd travel link arm, wherein a first travel driving motor and a first speed reducer, interlocked with the first travel driving motor to reduce a rotational speed of the first travel driving motor by half, are installed in a sealed inner space of the $(1\_1)$-st travel link arm, wherein a $(1\_1)$-st drive shaft, having a hollow formed therein and interlocked with the first speed reducer, and a $(1\_1)$-st output shaft interlocked with the $(1\_1)$-st drive shaft are sealingly installed on a $(1\_1)$-st one-end area of the $(1\_1)$-st travel link arm, wherein a $(1\_2)$-nd drive shaft, having a hollow formed therein and interlocked with the first travel driving motor, and a $(1\_2)$-nd output shaft interlocked with the $(1\_2)$-nd drive shaft are sealingly installed on a $(1\_1)$-st opposite-end area of the $(1\_1)$-st travel link arm, wherein the $(1\_1)$-st output shaft of the $(1\_1)$-st travel link arm is fixedly engaged with a $(1\_1)$-st linking member that is inserted into the $(1\_2)$-nd upper space of the travel arm platform to be fixedly engaged with the (1_2)-nd locking member, and wherein a (1_2)-nd one-end area of the (1_2)-nd travel link arm is fixedly engaged with the (1_2)-nd output shaft of the (1_1)-st travel link arm; a second travel arm part including a (2_1)-st travel link arm and a (2_2)-nd travel link arm, wherein a second travel driving motor and a second speed reducer, interlocked with the second travel driving motor to reduce a rotational speed of the second travel driving motor by half, are installed in a sealed inner space of the (2_1)-st travel link arm, wherein a (2_1)-st drive shaft, having a hollow formed therein and interlocked with the second speed reducer, and a (2_1)-st output shaft interlocked with the (2_1)-st drive shaft are sealingly installed on a (2_1)-st one-end area of the (2_1)-st travel link arm, wherein a (2_2)-nd drive shaft, having a hollow formed therein and interlocked with the second travel driving motor, and a (2_2)-nd output shaft interlocked with the (2_2)-nd drive shaft are sealingly installed on a (2_1)-st opposite-end area of the (2_1)-st travel link arm, wherein the (2_1)-st output shaft of the (2_1)-st travel link arm is fixedly engaged with a (1_2)-nd linking member that is inserted into the (1_3)-rd upper space of the travel arm platform to be fixedly engaged with the (1_3)-rd locking member, and wherein a (2_2)-nd one-end area of the (2_2)-nd travel link arm is fixedly engaged with the (2_2)-nd output shaft of the (2_1)-st travel link arm; and a transfer robot coupling part whose second one-end area is rotatably engaged with a (1_2)-nd opposite-end area of the (1_2)-nd travel link arm, whose second opposite-end area is rotatably engaged with a (2_2)-nd opposite-end area of the (2_2)-nd travel link arm, and whose second center area has a rotation driving motor built thereon, wherein the rotation driving motor is sealingly engaged with the substrate transfer robot, for transferring a substrate, by a rotation drive shaft having a hollow formed therein.

As one example, the transfer robot coupling part further includes a compliance part formed at one of the second one-end area and the second opposite-end area, wherein the compliance part changes, within the transfer robot coupling part, one of a position at which the (1_2)-nd opposite-end area of the (1_2)-nd travel link arm is rotatably engaged and a position at which the (2_2)-nd opposite-end area of the (2_2)-nd travel link arm is rotatably engaged, in response to an external force exerted.

As one example, the compliance part includes: a sliding member that slides in a longitudinal direction of the transfer robot coupling part within one of the second one-end area and the second opposite-end area, and is rotatably engaged with one of the (1_2)-nd opposite-end area of the (1_2)-nd travel link arm and the (2_2)-nd opposite-end area of the (2_2)-nd travel link arm; and elastic members each of which is formed on each of sliding paths located on both sides of the sliding member inside one of the second one-end area and the second opposite-end area.

As one example, the travel arm platform further includes: a first wiring hole bridging the (1_1)-st upper space and the (1_2)-nd lower space; and a second wiring hole bridging the (1_1)-st upper space and the (1_3)-rd lower space.

As one example, the travel arm platform further includes: a (1_1)-st wiring hole and a (1_2)-nd wiring hole, each bridging the (1_1)-st upper space and one side of a body of the travel arm platform; a (2_1)-st wiring hole, bridging the (1_2)-nd lower space and the one side of the body of the travel arm platform; a (2_2)-nd wiring hole, bridging the (1_3)-rd lower space and the one side of the body of the travel arm platform; a first sealing cover, sealing the (1_1)-st wiring hole and the (2_1)-st wiring hole at the one side of the body of the travel arm platform; and a second sealing cover, sealing the (1_2)-nd wiring hole and the (2_2)-nd wiring hole at the one side of the body of the travel arm platform.

As one example, the travel robot further comprises: a first wiring for an operation of the first travel driving motor; and a second wiring for an operation of the second travel driving motor, wherein the first wiring is fed into the first travel driving motor through the hollow of the elevating drive shaft and the hollow of the (1_1)-st drive shaft so as to prevent the first wiring from being exposed to an inner space of the vacuum chamber, and wherein the second wiring is fed into the second travel driving motor through the hollow of the elevating drive shaft and the hollow of (2_1)-st drive shaft so as to prevent the second wiring from being exposed to the inner space of the vacuum chamber.

As one example, the travel robot is provided with a (1_1)-st intersection point, a (1_2)-nd intersection point, a (2_1)-st intersection point, a (2_2)-nd intersection point, a (3_1)-st intersection point and a (3_2)-nd intersection point, wherein the (1_1)-st intersection point is a point at which a longitudinal center line of the travel arm platform and a longitudinal center line of the (1_1)-st travel link arm intersect, wherein the (1_2)-nd intersection point is a point at which the longitudinal center line of the travel arm platform and a longitudinal center line of the (2_1)-st travel link arm intersect, wherein the (2_1)-st intersection point is a point at which the longitudinal center line of the (1_1)-st travel link arm and a longitudinal center line of a (1_2)-nd travel link arm intersect, wherein the (2_2)-nd intersection point is a point at which the longitudinal center line of the (2_1)-st travel link arm and a longitudinal center line of the (2_2)-nd travel link arm intersect, wherein the (3_1)-st intersection point is a point at which the longitudinal center line of the (1_2)-nd travel link arm and a longitudinal center line of the transfer robot coupling part intersect, and wherein the (3_2)-nd intersection point is a point at which the longitudinal center line of the (2_2)-nd travel link arm and the longitudinal center line of the transfer robot coupling part intersect, wherein a distance between the (1_1)-st intersection point and the (1_2)-nd intersection point and a distance between the (3_1)-st intersection point and the (3_2)-nd intersection point are determined as same with each other, and a distance between the (1_1)-st intersection point and the (2_1)-st intersection point, a distance between the (2_1)-st intersection point and the (3_1)-st intersection point, a distance between the (1_2)-nd intersection point and the (2_2)-nd intersection point and a distance between the (2_2)-nd intersection point and the (3_2)-nd intersection point are determined as same with each other, and wherein an absolute value of an angle formed between the travel arm platform and the (1_1)-st travel link arm at the (1_1)-st intersection point is determined as same with an absolute value of an angle formed between the travel arm platform and the (2_1)-st travel link arm at the (1_2)-nd intersection point, an absolute value of an angle formed between the (1_1)-st travel link arm and the (1_2)-nd travel link arm at the (2_1)-st intersection point is determined as same with an absolute value of an angle formed between the (2_1)-st travel link arm and the (2_2)-nd travel link arm at the (2_2)-nd intersection point, and an absolute value of an angle formed between the (1_2)-nd travel link arm and the transfer robot coupling part at the (3_1)-st intersection point is determined as same with an absolute value of an angle formed between the (2_2)-nd travel link arm and the transfer robot coupling part at the (3_2)-nd intersection point.

As one example, the first travel driving motor and the second travel driving motor operate in an identical manner, but rotate in opposite directions from each other.

As one example, the substrate transfer robot includes: a transfer arm platform through which a (2_1)-st coupling hole, a (2-2)-nd coupling hole and a (2_3)-rd coupling hole are formed respectively at a third center area, a third one-end area and a third opposite-end area thereof, wherein a (2_1)-st locking member, through which a (2_1)-st through-hole corresponding to the hollow of the rotation drive shaft of the rotation driving motor of the transfer robot coupling part is formed, compartmentalizes the (2_1)-st coupling hole into a (2_1)-st upper space sealed by a (2_1)-st cover and a (2_1)-st lower space, wherein a (2_2)-nd locking member, through which a (2_2)-nd through-hole is formed, compartmentalizes the (2_2)-nd coupling hole into a (2_2)-nd upper space and a (2_2)-nd lower space sealed by a (2_2)-nd cover, wherein a (2_3)-rd locking member, through which a (2_3)-rd through-hole is formed, compartmentalizes the (2_3)-rd coupling hole into a (2_3)-rd upper space and a (2_3)-rd lower space sealed by a (2_3)-rd cover, wherein a link connecting member including a (1_1)-st blade and a (1_2)-nd blade for link connection is fixedly engaged at a front area, with a direction of the front area being a direction of a processing chamber from the substrate transfer robot when the substrate transfer robot is positioned to transfer a substrate to the processing chamber coupled with the vacuum chamber, and wherein the rotation drive shaft of the rotation driving motor inserted into the (2_1)-st lower space is fixedly engaged with the (2_1)-st locking member; a first transfer arm part including a (1_1)-st transfer link arm, a (1_2)-nd transfer link arm, a first common link arm, a (1_1)-st subordinate link arm parallel to the (1_1)-st transfer link arm, a (1_2)-nd subordinate link arm parallel to the (1_2)-nd transfer link arm, a (1_3)-rd subordinate link arm parallel to the first common link arm, and a first end effector, wherein a first transfer driving motor and a third speed reducer, interlocked with the first transfer driving motor to reduce a rotational speed of the first transfer driving motor by half, are installed in a sealed inner space of the (1_1)-st transfer link arm, wherein a (3_1)-st drive shaft, having a hollow formed therein and interlocked with the third speed reducer, and a (3_1)-st output shaft interlocked with the (3_1)-st drive shaft are sealingly installed on a (3_1)-st one-end area of the (1_1)-st transfer link arm, wherein a (3_2)-nd drive shaft, having a hollow formed therein and interlocked with the first transfer driving motor, and a (3_2)-nd output shaft interlocked with the (3_2)-nd drive shaft are sealingly installed on a (3_1)-st opposite-end area of the (1_1)-st transfer link arm, wherein the (3_1)-st output shaft of the (1_1)-st transfer link arm is fixedly engaged with a (2_1)-st linking member that is inserted into the (2_2)-nd upper space of the transfer arm platform to be fixedly engaged with the (2_2)-nd locking member, wherein a (3_2)-nd one-end area of the (1_2)-nd transfer link arm is fixedly engaged with the (3-2)-nd output shaft of the (1_1)-st transfer link arm through a first fixed coupling shaft, wherein a fourth center area of the first common link arm is rotatably engaged with the first fixed coupling shaft, wherein a (3_4)-th one-end area of the (1_1)-st subordinate link arm is rotatably engaged with the (1_1)-st blade of the link connecting member of the transfer arm platform, and a (3_4)-th opposite-end area of the (1_1)-st subordinate link arm is rotatably engaged with a (3_3)-rd one-end area of the first common link arm, wherein a (3_5)-th one-end area of the (1_2)-nd subordinate link arm is rotatably engaged with a (3_3)-rd opposite-end area of the first common link arm, wherein a (3_6)-th one-end area of the (1_3)-rd subordinate link arm is rotatably engaged with a (3_5)-th opposite-end area of the (1_2)-nd subordinate link arm, and a (3_6)-th opposite-end area of the (1_3)-rd subordinate link arm is rotatably engaged with a (3_2)-nd opposite-end area of the (1_2)-nd transfer link arm, and wherein the first end effector is fixed to the (3_6)-th opposite-end area of the (1_3)-rd subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_2)-nd transfer link arm, a (2_3)-rd subordinate link arm parallel to the second common link arm, and a second end effector, wherein a second transfer driving motor and a fourth speed reducer, interlocked with the second transfer driving motor to reduce a rotational speed of the second transfer driving motor by half, are installed in a sealed inner space of the (2_1)-st transfer link arm, wherein a (4_1)-st drive shaft, having a hollow formed therein and interlocked with the fourth speed reducer, and a (4_1)-st output shaft interlocked with the (4_1)-st drive shaft are sealingly installed on a (4_1)-st one-end area of the (2_1)-st transfer link arm, wherein a (4_2)-nd drive shaft, having a hollow formed therein and interlocked with the second transfer driving motor, and a (4_2)-nd output shaft interlocked with the (4_2)-nd drive shaft are sealingly installed on a (4_1)-st opposite-end area of the (2_1)-st transfer link arm, wherein the (4_1)-st output shaft of the (2_1)-st transfer link arm is fixedly engaged with a (2_2)-nd linking member that is inserted into the (2_3)-rd upper space of the transfer arm platform to be fixedly engaged with the (2_3)-rd locking member, wherein a (4_2)-nd one-end area of the (2_2)-nd transfer link arm is fixedly engaged with the (4-2)-nd output shaft of the (2_1)-st transfer link arm through a second fixed coupling shaft, wherein a fifth center area of the second common link arm is rotatably engaged with the second fixed coupling shaft, wherein a (4_4)-th one-end area of the (2_1)-st subordinate link arm is rotatably engaged with the (1_2)-nd blade of the link connecting member of the transfer arm platform, and a (4_4)-th opposite-end area of the (2_1)-st subordinate link arm is rotatably engaged with a (4_3)-rd one-end area of the second common link arm, wherein a (4_5)-th one-end area of the (2_2)-nd subordinate link arm is rotatably engaged with a (4_3)-rd opposite-end area of the second common link arm, wherein a (4_6)-th one-end area of the (2_3)-rd subordinate link arm is rotatably engaged with a (4_5)-th opposite-end area of the (2_2)-nd subordinate link arm, and a (4_6)-th opposite-end area of the (2_3)-rd subordinate link arm is rotatably engaged with a (4_2)-nd opposite-end area of the (2_2)-nd transfer link arm, and wherein the second end effector is fixedly engaged with the (4_6)-th opposite-end area of the (2_3)-rd subordinate link arm through a bracket to thereby support the substrate.

As one example, the (3_1)-st opposite-end area of the (1_1)-st transfer link arm of the first transfer arm part is located at the front area of the transfer arm platform, and the (4_1)-st opposite-end area of the (2_1)-st transfer link arm of the second transfer arm part is located at a rear area of the transfer arm platform.

As one example, the transfer arm platform further includes: a third wiring hole bridging the (2_1)-st upper space and the (2_2)-nd lower space; and a fourth wiring hole bridging the (2_1)-st upper space and the (2_3)-rd lower space.

As one example, the transfer arm platform further includes: a (3_1)-st wiring hole and a (3_2)-nd wiring hole, each bridging the (2_1)-st upper space and one side of a body of the transfer arm platform; a (4_1)-st wiring hole, bridging the (2_2)-nd lower space and the one side of the body of the transfer arm platform; a (4_2)-nd wiring hole, bridging the (2_3)-rd lower space and the one side of the body of the transfer arm platform; a third sealing cover, sealing the (3_1)-st wiring hole and the (4_1)-st wiring hole at the one side of the body of the transfer arm platform; and a fourth sealing cover, sealing the (3_2)-nd wiring hole and the (4_2)-nd wiring hole at the one side of the body of the transfer arm platform.

As one example, the substrate transfer robot further includes: a third wiring for an operation of the first transfer driving motor; and a fourth wiring for an operation of the second transfer driving motor, wherein the third wiring is fed into the first transfer driving motor through the hollow of the elevating drive shaft, the hollow of the (1_1)-st drive shaft, the hollow of the (1_2)-nd drive shaft, the hollow of the rotation drive shaft and the hollow of the (3_1)-st drive shaft so as to prevent the third wiring from being exposed to an inner space of the vacuum chamber, and wherein the fourth wiring is fed into the second transfer driving motor through the hollow of the elevating drive shaft, the hollow of the (2_1)-st drive shaft, the hollow of the (2_2)-nd drive shaft, the hollow of the rotation drive shaft and the hollow of the (4_1)-st drive shaft so as to prevent the fourth wiring from being exposed to the inner space of the vacuum chamber.

BRIEF DESCRIPTION OF THE DRAWINGS

The accompanying drawings used to explain example embodiments of the present disclosure are only part of example embodiments of the present disclosure and other drawings can be obtained based on the drawings by those skilled in the art of the present disclosure without inventive work.

FIG. 2 is a drawing schematically illustrating another example of a cluster-type substrate processing equipment in which the travel robot is installed in accordance with one example embodiment of the present disclosure.

FIG. 8A and FIG. 8B are drawings schematically illustrating a substrate transfer robot to be combined with the travel robot in accordance with one example embodiment of the present disclosure.

DETAILED DESCRIPTION OF THE PREFERRED EMBODIMENTS

Figure 1:
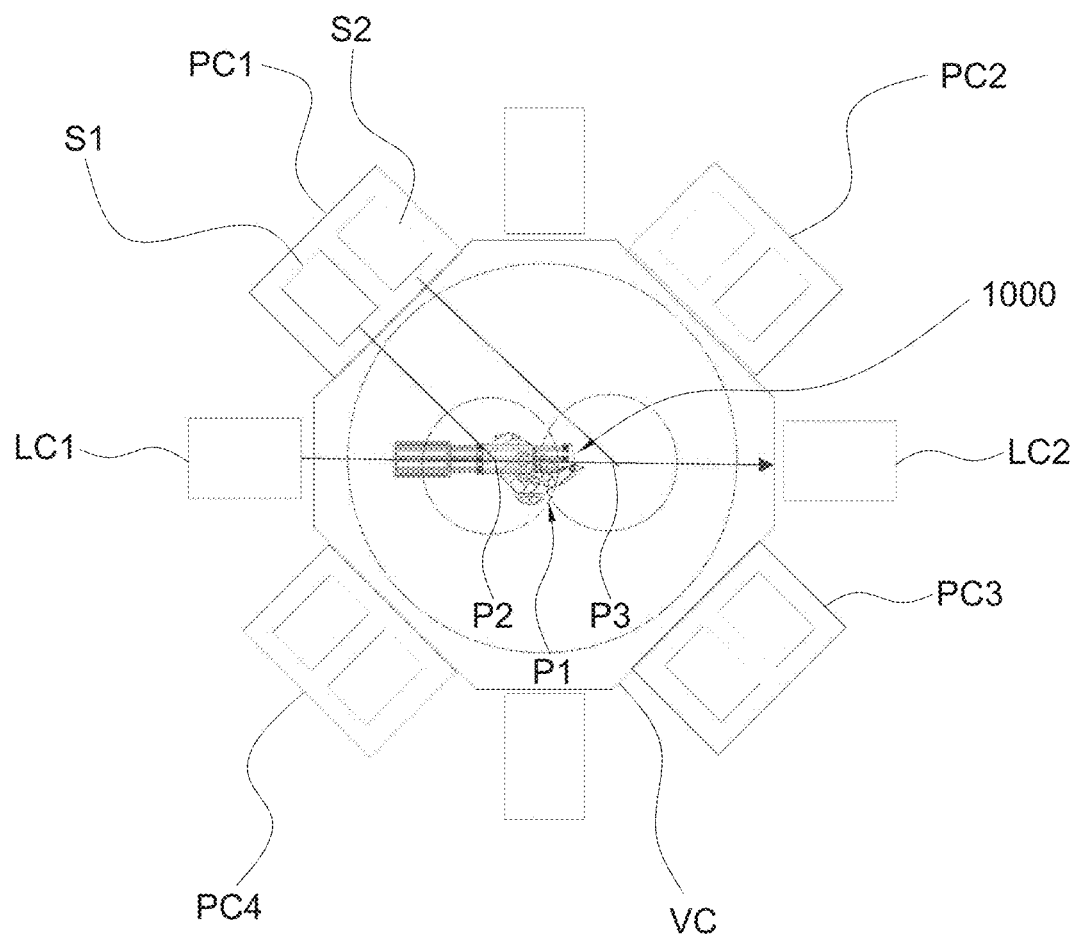
FIG. 1 is a drawing schematically illustrating an example of a cluster-type substrate processing equipment in which a travel robot is installed in accordance with one example embodiment of the present disclosure.

The following detailed description of the present disclosure refers to the accompanying drawings, which show by way of illustration a specific embodiment in which the present disclosure may be practiced, in order to clarify the objects, technical solutions and advantages of the present disclosure. These embodiments are described in sufficient detail to enable those skilled in the art to practice the present disclosure.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

As used herein, the term "(A_B)-th" and similar terminology is intended to distinguish elements constituting the travel robot of the present invention, herein, the "A" represents elements constituting the travel robot and the "B" represents sub-elements included in each of the elements. As used herein, A and B are generally integer numbers that sequentially describe respective elements/sub-elements of the systems and methods described herein.

To allow those skilled in the art to carry out the present disclosure easily, the example embodiments of the present disclosure will be explained by referring to attached diagrams in detail as shown below.

FIG. 1 and FIG. 2 are drawings schematically illustrating a cluster-type substrate processing equipment in which a travel robot is installed in accordance with one example embodiment of the present disclosure.

FIG. 1 shows a substrate processing equipment having four process chambers PC1, PC2, PC3, and PC4 installed at a vacuum chamber which is a transfer chamber of an octagonal structure, wherein each of the four process chambers is made to place two substrates S1 and S2 thereon. Herein, the travel robot 1000 is fixedly installed at a specific location P1 in the vacuum chamber VC and moves a substrate transfer robot for transferring a substrate in order to account for an offset distance generated between locations of each of the two substrates in each of the process chambers.

As an example, given that the travel robot 1000 has moved and positioned the substrate transfer robot at a first position P2 which corresponds to a first substrate position, i.e., a position of a first substrate S1, in a specific process chamber PC1, the travel robot 1000 may rotate the substrate transfer robot to let the substrate transfer robot face the first substrate position so that the substrate transfer robot is able to load or unload the substrate onto or from the first substrate position.

Also, given that the travel robot 1000 has moved the substrate transfer robot and positioned the substrate transfer robot at a second position P3 which corresponds to a second substrate position, i.e., a position of a second substrate S2, in the specific process chamber PC1, the travel robot 1000 may rotate the substrate transfer robot to let the substrate transfer robot face the second substrate position so that the substrate transfer robot is able to load or unload the substrate onto or from the second substrate position.

On the other hand, FIG. 2 shows a substrate processing equipment with a vacuum chamber, i.e., a transfer chamber of a tetragonal structure, having two process chambers on each of its two sides, i.e., PC1 and PC2 on one side and PC3 and PC4 on the other side, wherein each of the four process chambers is made to place two substrates S1 and S2 thereon. Herein, the travel robot 1000 is fixedly installed at a specific location P1 in the vacuum chamber VC, and the substrate transfer robot is shifted around in order to account for different locations of each of the process chambers and different locations of each of the two substrates in each of the process chambers.

As an example, given that the travel robot 1000 has moved the substrate transfer robot and positioned the substrate transfer robot at a first position P2 which corresponds to a first substrate position, i.e., a position of the first substrate S1, in a first process chamber PC1, the travel robot 1000 may rotate the substrate transfer robot to let the substrate transfer robot face the first substrate position so that the substrate transfer robot is able to load or unload the substrate onto or from the first substrate position.

Also, given that the travel robot 1000 has moved the substrate transfer robot and positioned the substrate transfer robot at a second position P5 which corresponds to a second substrate position, i.e., a position of a second substrate S2, in a second process chamber PC2, the travel robot 1000 may rotate the substrate transfer robot to let the substrate transfer robot face the second substrate position so that the substrate transfer robot is able to load or unload onto or from the substrate from the second substrate position.

FIG. 1 and FIG. 2 are respectively illustrating examples of the substrate processing equipment having the octagonal structure and the tetragonal structure, but the present disclosure is not limited thereto and the travel robot 1000 in accordance with one example embodiment of the present disclosure may be fixedly installed at a specific location of a vacuum chamber of various structures to thereby move the substrate transfer robot along various set travel routes. Adding to this, the travel robot 1000 in accordance with one example embodiment of the present disclosure is able to perform rotation movements at its installed location so that various travel routes for the substrate transfer robot may be set based on combinations of a rotation angle of the travel robot 1000, a travel position of the substrate transfer robot and a rotation angle of the substrate transfer robot.

Figure 3A:
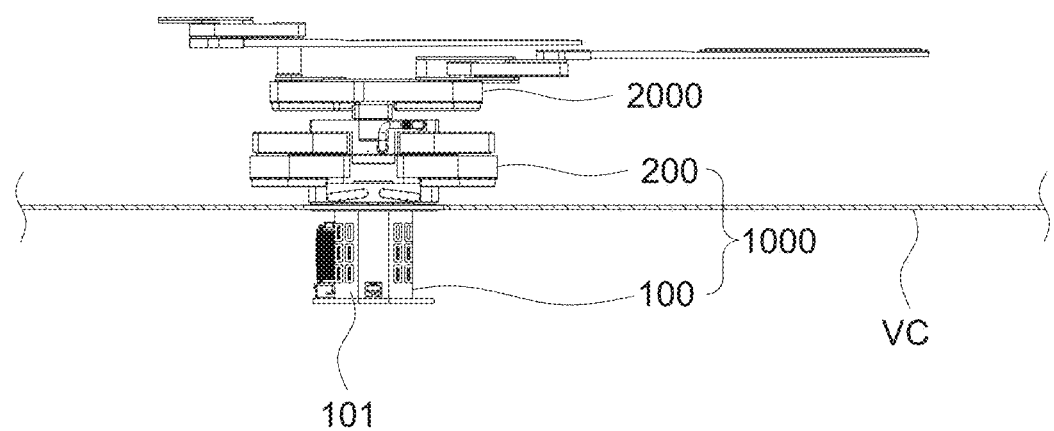
FIG. 3A and FIG. 3B are drawings schematically illustrating the travel robot in accordance with one example embodiment of the present disclosure.
Figure 3B:
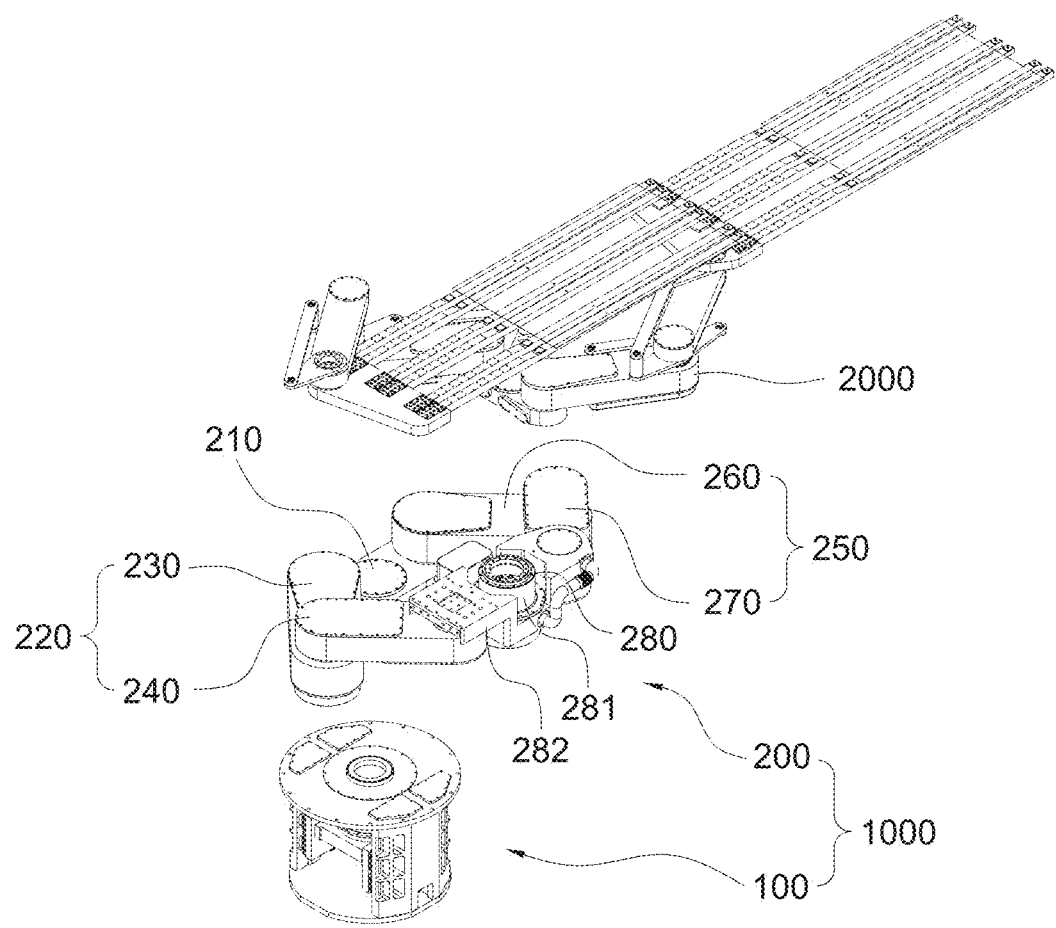

FIG. 3A and FIG. 3B are drawings schematically illustrating the travel robot 1000 in accordance with one example embodiment of the present disclosure.

Hereinafter, expressions "coupled with" and "engaged with" are used interchangeably to explain configurations where two components are combined, or combined to be moved together, within the travel robot, between the travel robot and the substrate transfer robot, or within the substrate transfer robot, according to corresponding explanations where the respective expressions are used.

By referring to FIG. 3A and FIG. 3B, the travel robot 1000 may include an elevating part 100 and a robot body 200 that is coupled with an upper region of the elevating part 100 and coupled with a lower region of a substrate transfer robot 2000.

First, the elevating part 100 may be located in a lower outer region of a housing VC, sealing an inside of the vacuum chamber, and have its upper end sealed to a vacuum chamber through-hole formed on a lower region of the housing VC, wherein the elevating part 100 may allow an elevating drive shaft 101 having a hollow formed therein to be moved up and down through the vacuum chamber through-hole. Through this, the travel robot 1000 may adjust a vertical position of the substrate transfer robot 2000 so that the substrate transfer robot 2000 is positioned at an appropriate height for loading or unloading the substrate onto or from the process chamber and the like.

In addition to vertically moving the elevating drive shaft 101, the elevating part 100 may further perform an operation of rotating the elevating drive shaft 101. Through this, the travel robot 1000 may move the substrate transfer robot 2000 in various directions according to a rotation angle of the elevating part 100.

Next, the robot body 200 may include a travel arm platform 210 coupled with the elevating part 100, a first travel arm part 220 and a second travel arm part 250 which are coupled with the travel arm platform 210 symmetrically to each other, and a transfer robot coupling part 280 which is coupled with the first travel arm part 220 and the second travel arm part 250 and supports the substrate transfer robot 2000 for transferring the substrate. Herein, the substrate transfer robot 2000 may be moved within the vacuum chamber by making the transfer robot coupling part 280 move forward and backward with operations of the first travel arm part 220 and the second travel arm part 250.

Through this, in a state where the travel robot 1000 has been fixed at a specific position in the vacuum chamber, the travel robot 1000 may move the transfer robot coupling part 280 in linear directions, i.e., in forward and backward directions, with the operations of the first travel arm part 220 and the second travel arm part 250 so that the substrate transfer robot 2000 coupled with the transfer robot coupling part 280 is moved along with the transfer robot coupling part 280 and moved to a set position such as a position for loading or unloading the substrate onto or from the process chamber, etc. Also, the travel robot 1000 may adjust a vertical position of the substrate transfer robot 2000 by a vertical movement of the elevating part 100 so that the substrate transfer robot 2000 is able to load or unload the substrate onto or from the process chamber, etc.

The travel robot 1000 in accordance with one example embodiment of the present disclosure is further described in detail as follows:

First, the travel arm platform 210 may be coupled with the elevating part 100.

Figure 4A:
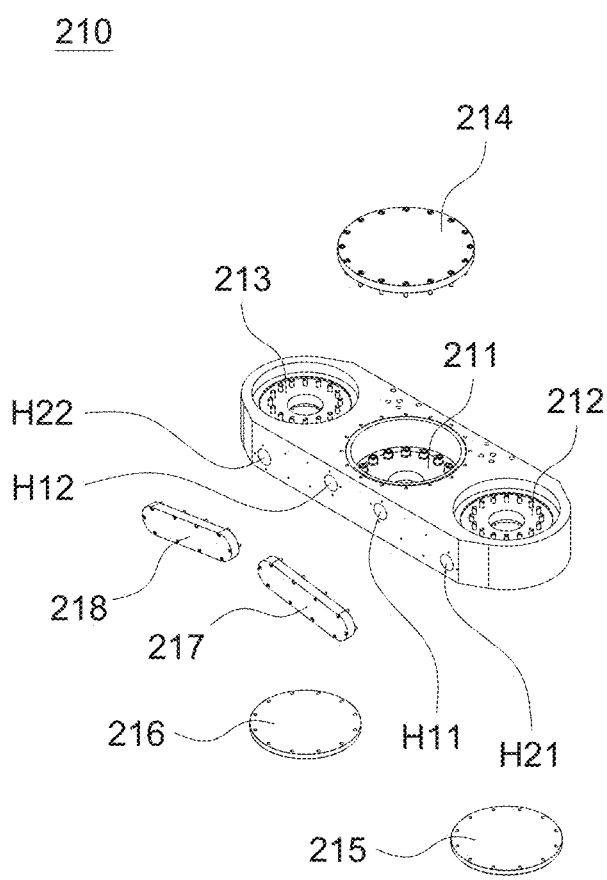
FIG. 4A to FIG. 4C are drawings schematically illustrating a travel arm platform of the travel robot in accordance with one example embodiment of the present disclosure.
Figure 4B:
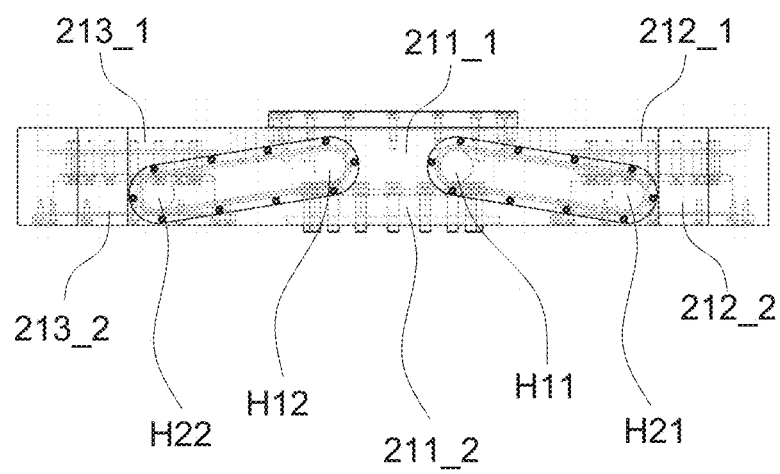

Herein, by referring to FIG. 4A and FIG. 4B, the travel arm platform 210 may include a (1_1)-st coupling hole 211 formed at a first center area, a (1_2)-nd coupling hole 212 formed at a first one-end area, and a (1_3)-rd coupling hole 213 formed at a first opposite-end area.

The (1_1)-st coupling hole 211 at the first center area may be compartmentalized into a (1_1)-st upper space 211_1 and a (1_1)-st lower space 211_2 by a (1_1)-st locking member that has a (1_1)-st through-hole corresponding to the hollow of the elevating drive shaft 101 of the evaluating part 100, and the (1_1)-st upper space 211_1 may be sealed by a (1_1)-st cover 214.

In addition, the (1_2)-nd coupling hole 212 at the first one-end area may be compartmentalized into a (1_2)-nd upper space 212_1 and a (1_2)-nd lower space 212_2 by a (1_2)-nd locking member that has a (1_2)-nd through-hole, and the (1_2)-nd lower space 212_2 may be sealed by a (1_2)-nd cover 215.

Further, the (1_3)-rd coupling hole 213 at the first opposite-end area may be compartmentalized into a (1_3)-rd upper space 213_1 and a (1_3)-rd lower space 213_2 by a (1_3)-rd locking member that has a (1_3)-rd through-hole, and the (1_3)-rd lower space 213_2 may be sealed by a (1_3)-rd cover 216.

Also, the travel arm platform 210 may be coupled with the elevating part 100, and more specifically, the elevating drive shaft 101 of the elevating part 100 may be inserted into the (1_1)-st lower space 211_2 of the (1_1)-st coupling hole 211 so that the elevating drive shaft 101 is fixedly engaged with the (1_1)-st locking member. Herein, when the elevating drive shaft 101 is fixedly engaged with the (1_1)-st locking member, sealing at a coupling area between the elevating drive shaft 101 and the (1_1)-st locking member may be improved by adding sealing members such as an O-ring, a gasket, etc. Since a configuration of adding the sealing members, such as the O-ring, the gasket, etc., may be similarly applied to other coupling parts to be described hereinafter, a description thereof is omitted in the following description of the present disclosure.

Through this, exposure to an external environment through the hollow of the elevating drive shaft 101 may be sealed away, at the (1_1)-st coupling hole 211, from a vacuum environment of the inside of the vacuum chamber.

Meanwhile, wiring holes for introducing wirings that are inserted through the hollow of the elevating drive shaft 101 of the elevating part 100 into the first travel arm part 220 and the second travel arm part 250 may be formed on the travel arm platform 210.

That is, a (1_1)-st wiring hole h11 and a (1_2)-nd wiring hole h12, each bridging the (1_1)-st upper space 211_1 and one side of a body of the travel arm platform 210 may be formed. Also, a (2_1)-st wiring hole h21, bridging the (1_2)-nd lower space 212_2 and the one side of the body of the travel arm platform 210, and a (2_2)-nd wiring hole h22, bridging the (1_3)-rd lower space 213_2 and the one side of the body of the travel arm platform 210, may be formed.

In addition, for sealing the wiring holes, a first sealing cover 217 that seals the (1_1)-st wiring hole h11 and the (2_1)-st wiring hole h21 at the one side of the body of the travel arm platform 210 and a second sealing cover 218 that seals the (1_2)-nd wiring hole h12 and the (2_2)-nd wiring hole h22 at the one side of the body of the travel arm platform 210 may be provided.

Figure 4C:
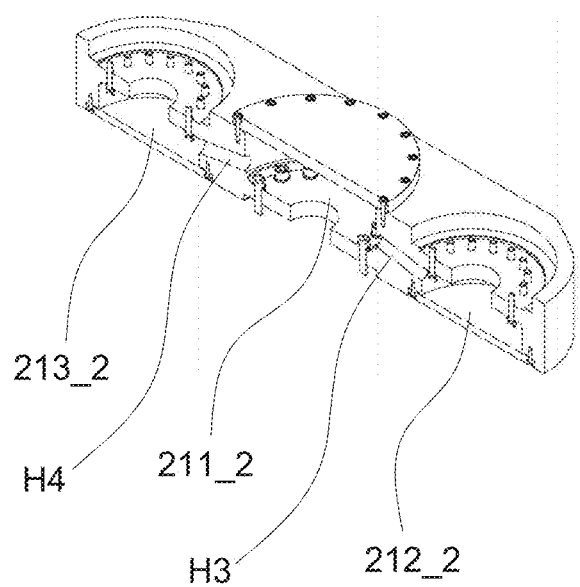

Further, by referring to FIG. 4C, the wiring holes for introducing the wirings that are inserted through the hollow of the elevating drive shaft 101 of the elevating part 100 into the first travel arm part 220 and the second travel arm part 250 may also be formed inside the travel arm platform 210.

That is, within the body of the travel arm platform 210, a first wiring hole h3, bridging the (1_1)-st upper space 211_1 and the (1_2)-nd lower space 212_2, and a second wiring hole h4, bridging the (1_1)-st upper space 211_1 and the (1_3)-rd lower space 213_2, may be formed so that the inside of the travel arm platform 210 is sealed without using additional sealing members.

Next, a (1_1)-st travel link arm 230 of the first travel arm part 220 may be engaged with the travel arm platform 210 at the (1_2)-nd coupling hole 212 of the travel arm platform 210. Also, a (2_1)-st travel link arm 260 of the second travel arm part 250 may be engaged with the travel arm part platform 210 at the (1_3)-rd coupling hole 213 of the travel arm platform 210.

Figure 5:
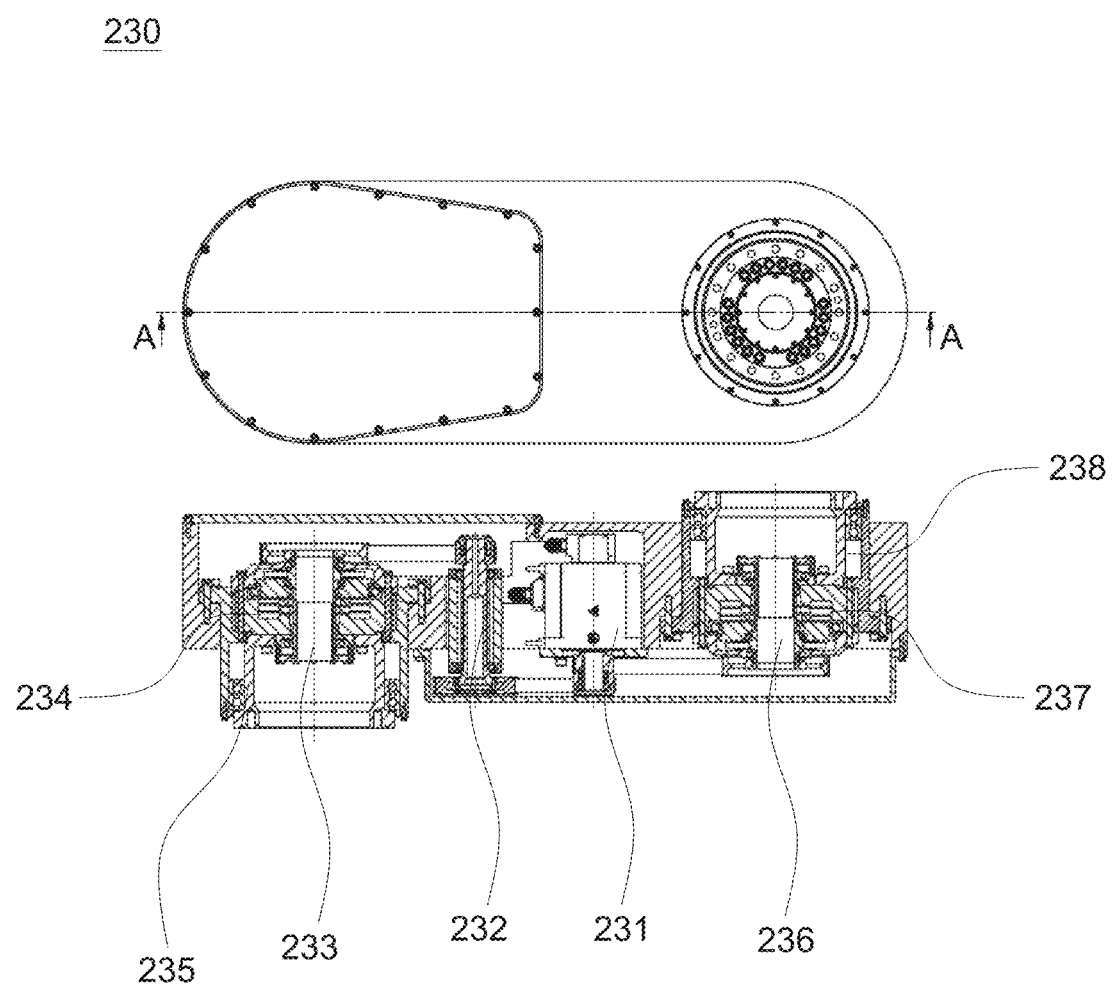
FIG. 5 is a drawing schematically illustrating a (1_1)-st travel link arm of the travel robot in accordance with one example embodiment of the present disclosure.

Herein, by referring to FIG. 5, the (1_1)-st travel link arm 230 of the first travel arm part 220 may have a sealed inner space, and a first travel driving motor 231 and a first speed reducer 232, interlocked with the first travel driving motor 231 to reduce a rotational speed of the first travel driving motor 231 by half, may be installed in the sealed inner space of the (1_1)-st travel link arm 230.

Also, a (1_1)-st drive shaft 233, having a hollow formed therein and interlocked with the first speed reducer 232, and a (1_1)-st output shaft 234 interlocked with the (1_1)-st drive shaft 233 may be sealingly installed on a (1_1)-st one-end area of the (1_1)-st travel link arm 230. Further, a (1_2)-nd drive shaft 236, having a hollow formed therein and interlocked with the first travel driving motor 231, and a (1_2)-nd output shaft 237 interlocked with the (1_2)-nd drive shaft 236 may be sealingly installed on a (1_1)-st opposite-end area of the (1_1)-st travel link arm 230. Herein, the interlocking between the first travel driving motor 231 and the first speed reducer 232, the interlocking between the first speed reducer 232 and the (1_1)-st drive shaft 233 and the interlocking between the first travel driving motor 231 and the (1_2)-nd drive shaft 236 may be respectively achieved by using a pulley method, but the present disclosure is not limited thereto, and various methods, such as a gear method, etc., may be used for transmitting rotational force. Also, the (1_1)-st drive shaft 233 and the (1_1)-st output shaft 234, and the (1_2)-nd drive shaft 236 and the (1_2)-nd output shaft 237 may each be formed with a speed reducer having a same speed reduction ratio with each other. Adding to this, the (1_1)-st output shaft 234 and the (1_2)-nd output shaft 237 may rotate in opposite directions from each other.

Further, the (1_1)-st output shaft 234 that is installed at the (1_1)-st one-end area of the (1_1)-st travel link arm 230 of the first travel arm part 220 may be inserted into the (1_2)-nd upper space 212_1 of the (1_2)-nd coupling hole 212 of the travel arm platform 210 so as to be fixedly engaged with the (1_2)-nd locking member.

Herein, a (1_1)-st linking member 235 may be used for coupling the (1_1)-st output shaft 234 and the (1_2)-nd locking member, wherein the (1_1)-st linking member 235 may be a tube-shaped shaft having its length extended by a distance between the (1_1)-st output shaft 234 and the (1_2)-nd locking member at a location where the travel arm platform 210 and the (1_1)-st travel link arm 230 are coupled, and both ends of the (1_1)-st linking member 235 may be fixedly coupled with the (1_1)-st output shaft 234 and the (1_2)-nd locking member respectively.

Also, a (2_2)-nd travel link arm 270 of the second travel arm part 250 may be configured similarly to the (1_1)-st link arm 230 of the first travel arm part 220 described with reference to FIG. 5.

That is, the (2_1)-st travel link arm 260 of the second travel arm part 250 may have a sealed inner space, and a second travel driving motor and a second speed reducer, interlocked with the second travel driving motor to reduce a rotational speed of the second travel driving motor by half, may be installed in the sealed inner space of the (2_1)-st travel link arm 260.

In addition, a (2_1)-st drive shaft, having a hollow formed therein and interlocked with the second speed reducer, and a (2_1)-st output shaft interlocked with the (2_1)-st drive shaft may be sealingly installed on a (2_1)-st one-end area of the (2_1)-st travel link arm 260. Further, a (2_2)-nd drive shaft, having a hollow formed therein and interlocked with the second travel driving motor, and a (2_2)-nd output shaft interlocked with the (2_2)-nd drive shaft may be sealingly installed on a (2_1)-st opposite-end area of the (2_1)-st travel link arm 260. Herein, the interlocking between the second travel driving motor and the second speed reducer, the interlocking between the second speed reducer and the (2_1)-st drive shaft and the interlocking between the second travel driving motor and the (2_2)-nd drive shaft may be respectively be achieved by using the pulley method, but the present disclosure is not limited thereto, and various methods, such as the gear method, etc., may be used for transmitting the rotational force. Also, the (2_1)-st drive shaft and the (2_1)-st output shaft, and the (2_2)-nd drive shaft and the (2_2)-nd output shaft may each be formed with a speed reducer having a same speed reduction ratio with each other. Adding to this, the (2_1)-st output shaft and the (2_2)-nd output shaft 237 may rotate in opposite directions from each other.

Further, the (2_1)-st output shaft that is installed at the (2_1)-st one-end area of the (2_1)-st travel link arm 260 of the second travel arm part 250 may be inserted into the (1_3)-rd upper space of the (1_3)-rd coupling hole 213 of the travel arm platform 210 so as to be fixedly engaged with the (1_3)-rd locking member.

Herein, a (1_2)-nd linking member may be used for coupling the (2_1)-st output shaft and the (1_3)-rd locking member, wherein the (1_2)-nd linking member may be a tube-shaped shaft having its length extended by a distance between the (2_1)-st output shaft and the (1_3)-rd locking member at a location where the travel arm platform 210 and the (2_1)-st travel link arm 260 are coupled, and both ends of the (1_2)-nd linking member may be fixedly coupled with the (2_1)-st output shaft and the (1_3)-rd locking member respectively.

Next, the (1_2)-nd output shaft 237 of the (1_1)-st travel link arm 230 of the first travel arm part 220 may be fixedly engaged with a (1_2)-nd one-end area of a (1_2)-nd travel link arm 240, and the (2_2)-nd output shaft of the (2_1)-st travel link arm 260 of the second travel arm part 250 may be fixedly engaged with a (2_2)-nd one-end area of the (2_2)-nd travel link arm 270.

Herein, a linking member may be used for coupling the (1_2)-nd output shaft 237 and the (1_2)-nd one-end area, wherein the linking member 238 may be a tube-shaped shaft having its length extended by a distance between the (1_2)-nd output shaft 237 and a coupling region of the (1_2)-nd one-end area to be connected to the (1_2)-nd output shaft 237 at a location where the (1_1)-st travel link arm 230 and the (1_2)-nd travel link arm 240 are coupled, and both ends of the linking member 238 may be fixedly coupled with the (1_2)-nd output shaft 237 and the coupling region of the (1_2)-nd one-end area respectively. Also, another linking member may be used for coupling the (2_2)-nd output shaft and the (2_2)-nd one-end area, wherein the linking member may be a tube-shaped shaft having its length extended by a distance between the (2_2)-nd output shaft and a coupling region of the (2_2)-nd one-end area to be connected to the (2_2)-nd output shaft at a location where the (2_1)-st travel link arm 260 and the (2_2)-nd travel link arm 270 are coupled, and both ends of the linking member may be fixedly coupled with the (2_2)-nd output shaft and the coupling region of the (2_2)-nd one-end area respectively.

Next, the transfer robot coupling part 280 may be coupled with the (1_2)-nd travel link arm 240 and the (2_2)-nd travel link arm 270.

That is, a second one-end area of the transfer robot coupling part 280 may be rotatably engaged with a (1_2)-nd opposite-end area of the (1_2)-nd travel link arm 240, and a second opposite-end area of the transfer robot coupling part 280 may be rotatably engaged with a (2_2)-nd opposite-end area of the (2_2)-nd travel link arm 270.

In addition, at a second center area of the transfer robot coupling part 280, a rotation driving motor including a rotation drive shaft 281, having a hollow formed therein, may be sealingly formed, and the substrate transfer robot 2000, for transferring the substrate, may be sealingly engaged with the rotation drive shaft 281 having the hollow formed therein.

Also, at one of the second one-end area and the second opposite-end area of the transfer robot coupling part 280, a compliance part 282 which changes, within the transfer robot coupling part 280, one of a position at which the (1_2)-nd opposite-end area of the (1_2)-nd travel link arm 240 is rotatably engaged and a position at which the (2_2)-nd opposite-end area of the (2_2)-nd travel link arm 270 is rotatably engaged, in response to an external force exerted, may be formed.

Figure 6:
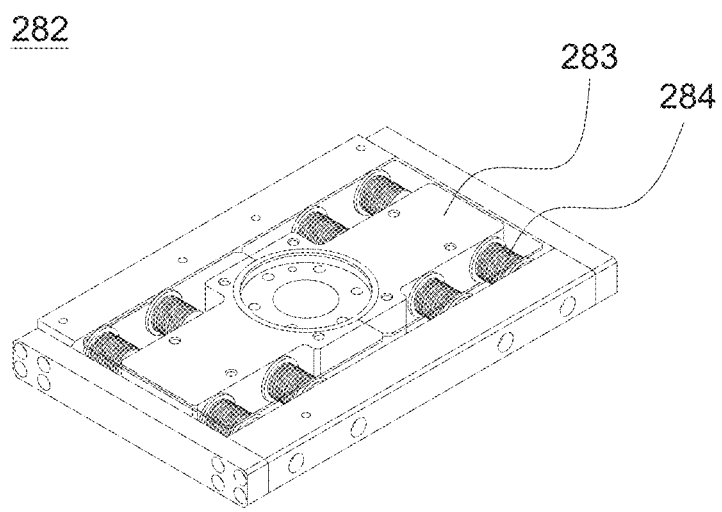
FIG. 6 is a drawing schematically illustrating a compliance of the travel robot in accordance with one example embodiment of the present disclosure.

Herein, by referring to FIG. 6, the compliance part 282 may include a sliding member 283 that slides in a longitudinal direction of the transfer robot coupling part 280 within one of the second one-end area and the second opposite-end area, and is rotatably engaged with one of the (1_2)-nd opposite-end area of the (1_2)-nd travel link arm 240 and the (2_2)-nd opposite-end area of the (2_2)-nd travel link arm 270. Also, the compliance part 282 may include elastic members 284 each of which is formed on each of sliding paths located on both sides of the sliding member 283 inside one of the second one-end area and the second opposite-end area. However, the compliance part 282 in accordance with the present disclosure may be implemented in various ways, such as a cylinder form using hydraulic pressure, apart from the configuration using the elastic members.

Figure 7:
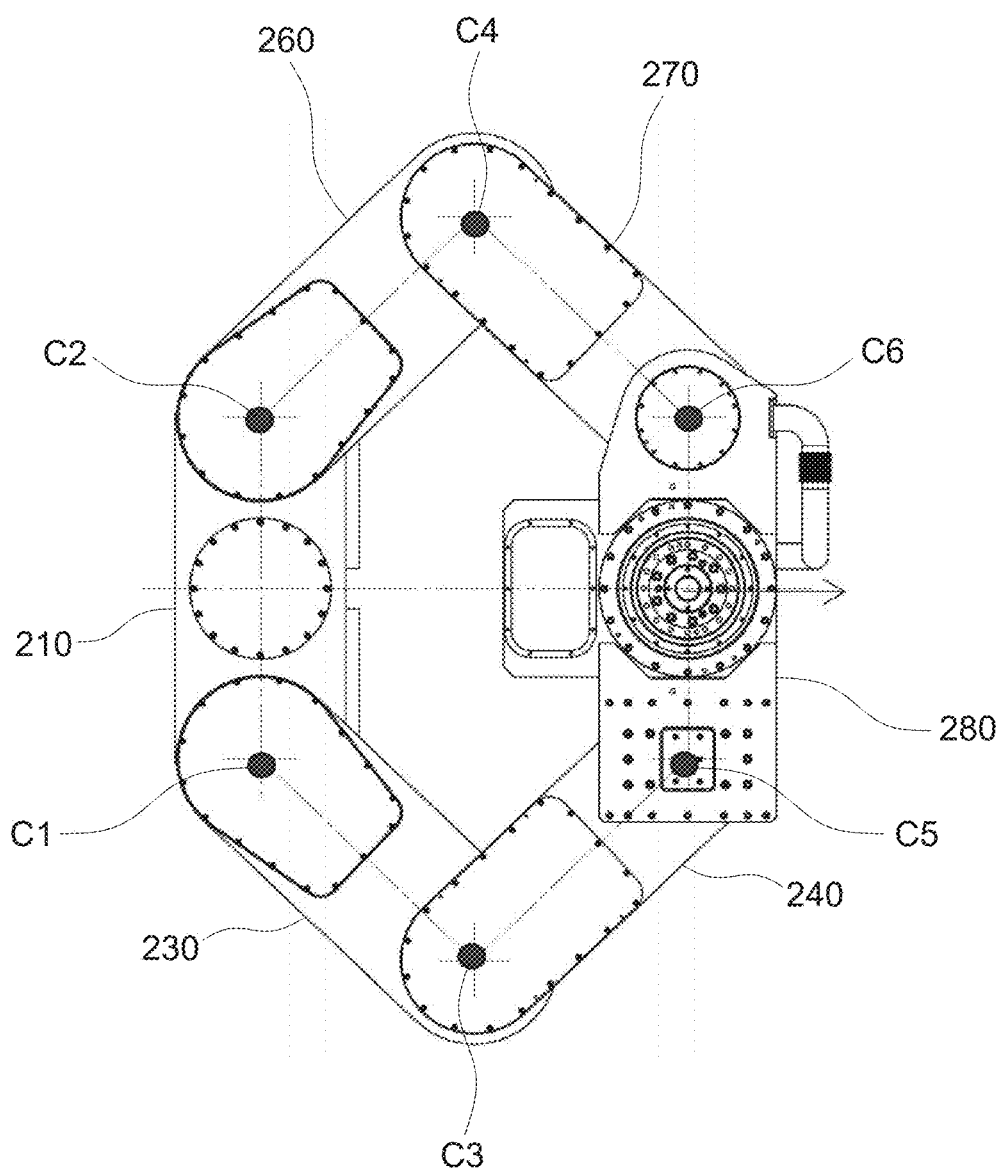
FIG. 7 is a drawing schematically illustrating link arms of the travel robot in accordance with one example embodiment of the present disclosure.

Meanwhile, by referring to FIG. 7, the travel robot 1000 may be provided with a (1_1)-st intersection point C1, a (1_2)-nd intersection point C2, a (2_1)-st intersection point C3, a (2_2)-nd intersection point C4, a (3_1)-st intersection point C5 and a (3_2)-nd intersection point C6, wherein the (1_1)-st intersection point C1 is a point at which a longitudinal center line of the travel arm platform 210 and a longitudinal center line of the (1_1)-st travel link arm 230 intersect, wherein the (1_2)-nd intersection point C2 is a point at which the longitudinal center line of the travel arm platform 210 and a longitudinal center line of the (2_1)-st travel link arm 260 intersect, wherein the (2_1)-st intersection point C3 is a point at which the longitudinal center line of the (1_1)-st travel link arm 230 and a longitudinal center line of a (1_2)-nd travel link arm 240 intersect, wherein the (2_2)-nd intersection point C4 is a point at which the longitudinal center line of the (2_1)-st travel link arm 260 and a longitudinal center line of the (2_2)-nd travel link arm 270 intersect, wherein the (3_1)-st intersection point C5 is a point at which the longitudinal center line of the (1_2)-nd travel link arm 240 and a longitudinal center line of the transfer robot coupling part 280 intersect, and wherein the (3_2)-nd intersection point C6 is a point at which the longitudinal center line of the (2_2)-nd travel link arm 270 and the longitudinal center line of the transfer robot coupling part 280 intersect. Herein, a distance between the (1_1)-st intersection point C1 and the (1_2)-nd intersection point C2 and a distance between the (3_1)-st intersection point C5 and the (3_2)-nd intersection point C6 may be set to be same with each other. Also, a distance between the (1_1)-st intersection point C1 and the (2_1)-st intersection point C3, a distance between the (2_1)-st intersection point C3 and the (3_1)-st intersection point C5, a distance between the (1_2)-nd intersection point C2 and the (2_2)-nd intersection point C5 and a distance between the (2_2)-nd intersection point C4 and the (3_2)-nd intersection point C6 may be set to be same with each other In addition, an absolute value of an angle formed between the travel arm platform 210 and the (1_1)-st travel link arm 230 at the (1_1)-st intersection point C1 may be set to be same with an absolute value of an angle formed between the travel arm platform 210 and the (2_1)-st travel link arm 260 at the (1_2)-nd intersection point C2. Also, an absolute value of an angle formed between the (1_1)-st travel link arm 230 and the (1_2)-nd travel link arm 240 at the (2_1)-st intersection point C3 may be set to be same with an absolute value of an angle formed between the (2_1)-st travel link arm 260 and the (2_2)-nd travel link arm 270 at the (2_2)-nd intersection point C4. Further, an absolute value of an angle formed between the (1_2)-nd travel link arm 240 and the transfer robot coupling part 280 at the (3_1)-st intersection point C5 may be set to be same with an absolute value of an angle formed between the (2_2)-nd travel link arm 270 and the transfer robot coupling part 280 at the (3_2)-nd intersection point C6.

Through this, the travel robot 1000 may move the substrate transfer robot 2000 supported by the transfer robot coupling part 280 forward or backward in along a linear path.

Herein, the first travel driving motor 231 installed on the (1_1)-st travel link arm 230 and the second travel driving motor installed on the (2_1)-st travel link arm 260 may operate in a similar manner, but rotate in opposite directions from each other.

Also, a first wiring for an operation of the first travel driving motor 231 and a second wiring for an operation of the second travel driving motor may be respectively disposed in an enclosed space inside the travel robot 1000.

Herein, the first wiring is fed into the first travel driving motor 231 through the hollow of the elevating drive shaft 101 and the hollow of the (1_1)-st drive shaft 233 so as to prevent the first wiring from being exposed to an inner space of the vacuum chamber. In addition, the second wiring is fed into the second travel driving motor through the hollow of the elevating drive shaft 101 and the hollow of (2_1)-st drive shaft so as to prevent the second wiring from being exposed to the inner space of the vacuum chamber. Meanwhile, the first wiring and the second wiring may be respectively branched from the elevating drive shaft 101 into the first travel arm part 220 and the second travel arm part 250 through a wiring hole formed at the travel arm platform 210.

Next, the substrate transfer robot 2000 corresponding to the travel robot 1000 in accordance with one example embodiment of the present disclosure may be described as follows.

Figure 8B:
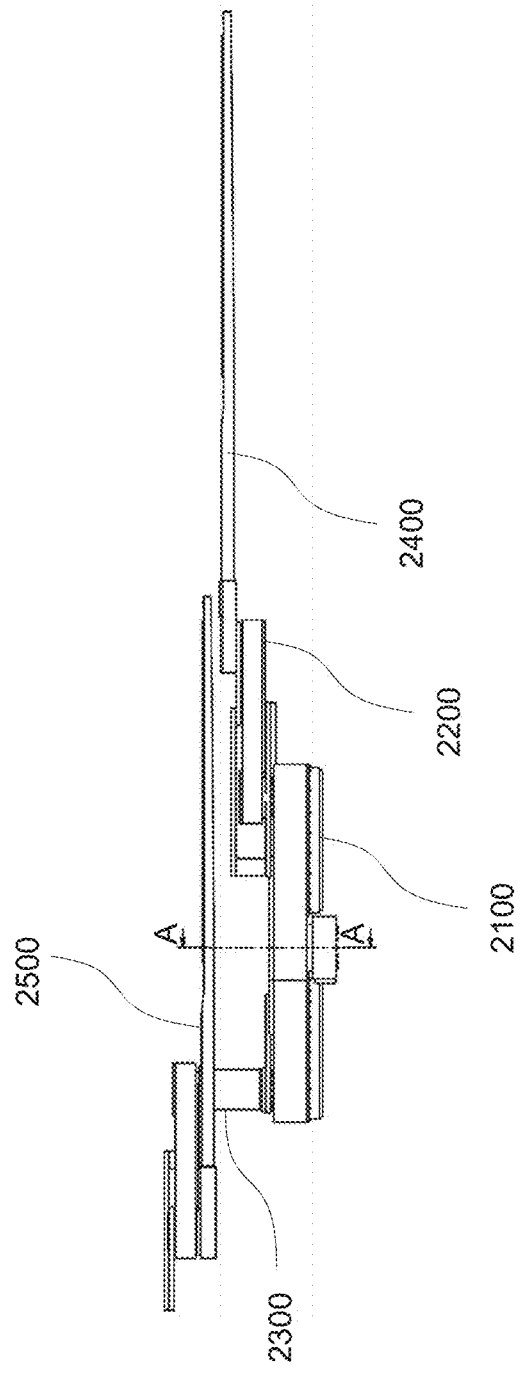

By referring to FIG. 8A and FIG. 8B, the substrate transfer robot 2000 may include a transfer arm platform 2100 engaged with the transfer robot coupling part 280, and may include a first transfer arm part 2200 and a second transfer arm part 2300 that are engaged with the transfer arm platform 2100. Herein, the first transfer arm part 2200 and the second transfer arm part 2300 may be respectively engaged with a first end effector 2400 and a second end effector 2500.

Through this, the substrate transfer robot 2000 may be moved to a particular location by traveling within the vacuum chamber by operations of the first travel arm part 220 and the second travel arm part 250 of the travel robot 1000 or by additional rotational movement of the elevating part 100 of the travel robot 1000. Further, in a state where the first end effector 2400 or the second end effector 2500 is positioned at a loading position of the substrate or an unloading position of the substrate by the vertical movement of the elevating part 100, the first end effector 2400 or the second end effector 2500 may load or unload the substrate by the operations of the first transfer arm part 2200 or the second transfer arm part 2300.

Figure 9A:
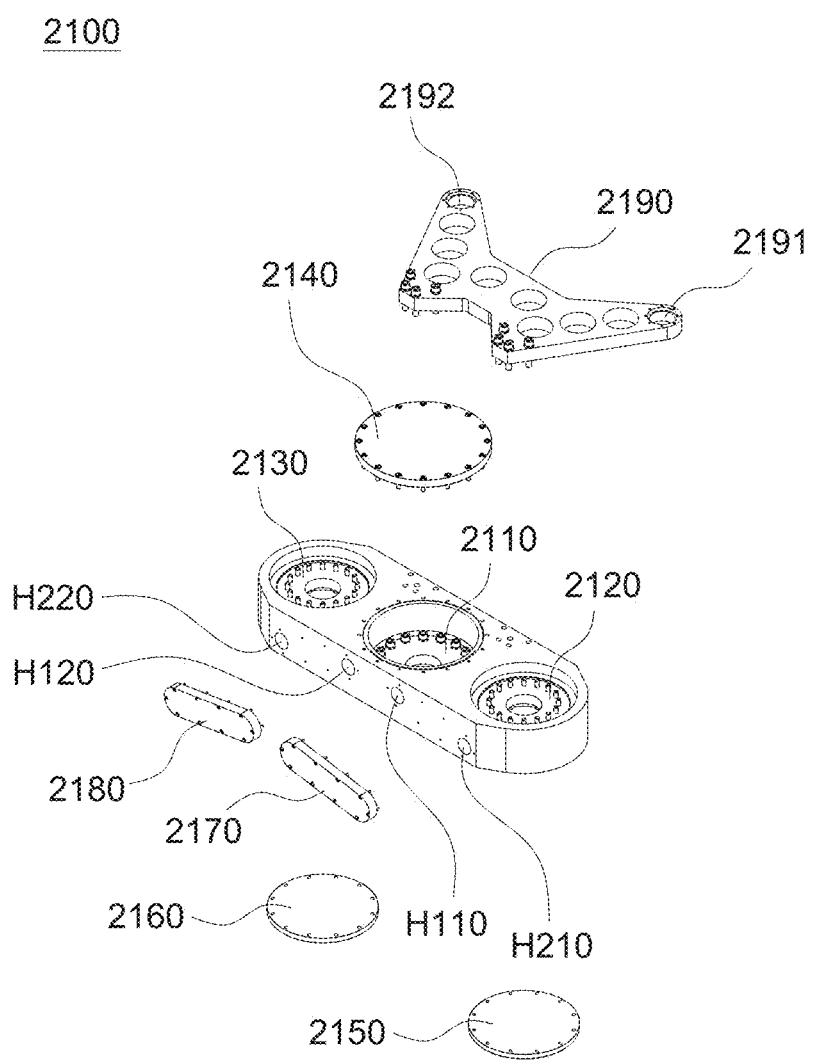
FIG. 9A and FIG. 9B are drawings schematically illustrating a transfer arm platform of the substrate transfer robot to be combined with the travel robot in accordance with one example embodiment of the present disclosure.
Figure 9B:
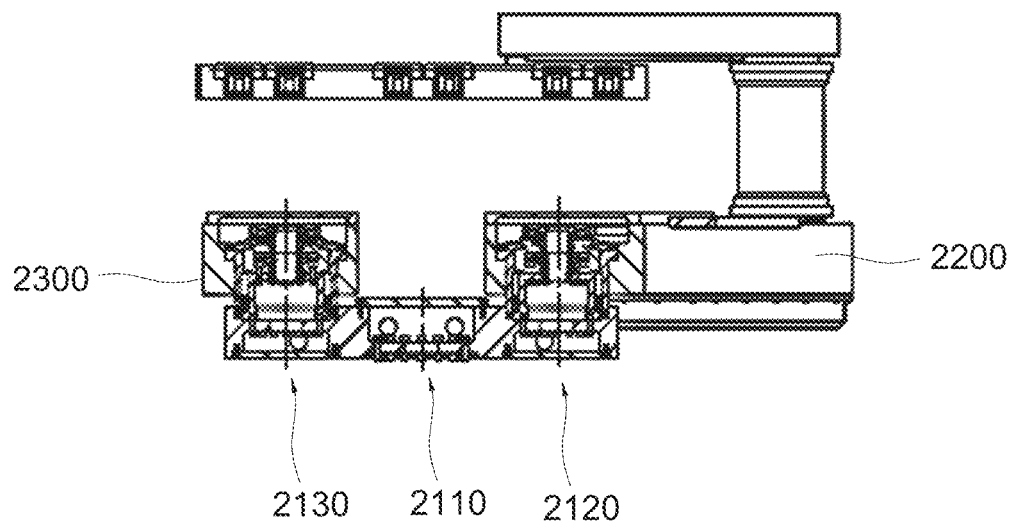

First, by referring to FIG. 9A and FIG. 9B, the transfer arm platform 2100 may include a (2_1)-st coupling hole 2110 formed at a third center area, a (2-2)-nd coupling hole 2120 formed at a third one-end area, and a (2_3)-rd coupling hole 2130 formed at a third opposite-end area. The transfer arm platform 2100 may have a configuration similar to that of the travel arm platform 210 of the travel robot 1000.

The (2_1)-st coupling hole 2110 at the third center area may be compartmentalized into a (2_1)-st upper space and a (2_1)-st lower space by a (2_1)-st locking member that has a (2_1)-st through-hole corresponding to the hollow of the rotation drive shaft 281 of the rotation driving motor of the transfer robot coupling part 280, and the (2_1)-st upper space may be sealed by a (2_1)-st cover.

In addition, the (2_2)-nd coupling hole 2120 at the third one-end area may be compartmentalized into a (2_2)-nd upper space and a (2_2)-nd lower space by a (2_2)-nd locking member that has a (2_2)-nd through-hole, and the (2_2)-nd lower space is sealed by a (2_2)-nd cover.

Further, the (2_3)-rd coupling hole 2130 at the third opposite-end area may be compartmentalized into a (2_3)-rd upper space and a (2_3)-rd lower space by a (2_3)-rd locking member that has a (2_3)-rd through-hole, and the (2_3)-rd lower space may be sealed by a (2_3)-rd cover.

Also, the transfer arm platform 2100 may have a link connecting member 2190 including a (1_1)-st blade 2191 and a (1_2)-nd blade 2192 for link connection that is fixedly engaged at its front area. Herein, a direction of the front area may be a direction of a processing chamber from the substrate transfer robot 2000 when the substrate transfer robot 2000 is positioned to transfer the substrate to the processing chamber coupled with the vacuum chamber.

Also, the transfer arm platform 2100 may be engaged with the travel robot 1000, and more specifically, the rotation drive shaft 281 of the rotation driving motor of the travel robot 1000 may be inserted into the (2_1)-st lower space of the (2_1)-st coupling hole 2110 so that the rotation drive shaft 281 is fixedly engaged with the (2_1)-st locking member. Herein, when the rotation drive shaft 281 is fixedly engaged with the (2_1)-st locking member, sealing at a coupling area between the rotation drive shaft 281 and the (2_1)-st locking member may be improved by adding the sealing members such as the O-ring, the gasket, etc. Since the configuration of adding the sealing members, such as the O-ring, the gasket, etc., may be similarly applied to other coupling parts to be described hereinafter, a description thereof is omitted in the following description of the present disclosure.

Through this, exposure to an external environment through the hollow of the rotation drive shaft 281 may be sealed away, at the (2_1)-st coupling hole 2110, from the vacuum environment of the inside of the vacuum chamber.

Meanwhile, wiring holes for introducing wirings that are inserted through the hollow of the rotation drive shaft 281 of the travel robot 1000 into the first transfer arm part 2200 and the second transfer arm part 2300 may be formed on the transfer arm platform 2100.

That is, a (3_1)-st wiring hole h110 and a (3_2)-nd wiring hole h120, each bridging the (2_1)-st upper space and one side of a body of the transfer arm platform 2100 may be formed. Also, a (4_1)-st wiring hole h210, bridging the (2_2)-nd lower space and the one side of the body of the transfer arm platform 2100, and a (4_2)-nd wiring hole h220, bridging the (2_3)-rd lower space and the one side of the body of the transfer arm platform 2100, may be formed.

In addition, for sealing the wiring holes, a third sealing cover 2170 that seals the (3_1)-st wiring hole h110 and the (4_1)-st wiring hole h210 at the one side of the body of the transfer arm platform 2100 and a fourth sealing cover 2180 that seals the (3_2)-nd wiring hole h120 and the (3_2)-nd wiring hole h220 at the one side of the body of the transfer arm platform 2100 may be provided.

Further, the wiring holes for introducing the wirings that are inserted through the hollow of the rotation drive shaft 281 of the travel robot 1000 into the first transfer arm part 2200 and the second transfer arm part 2300 may also be formed inside the transfer arm platform 2100.

That is, within the body of the transfer arm platform 2100, a third wiring hole, bridging the (2_1)-st upper space and the (2_2)-nd lower space, and a fourth wiring hole, bridging the (2_1)-st upper space and the (2_3)-rd lower space, may be formed so that the inside of the transfer arm platform 2100 is sealed without using additional sealing members.

Next, a (1_1)-st transfer link arm 2210 of the first transfer arm part 2200 may be engaged with the transfer arm platform 2100 at the (2_2)-nd coupling hole 2120 of the transfer arm platform 2100. Also, a (2_1)-st transfer link arm 2310 of the second transfer arm part 2300 may be engaged with the transfer arm part platform 2100 at the (2_3)-rd coupling hole 2130 of the transfer arm platform 2100.

Figure 10:
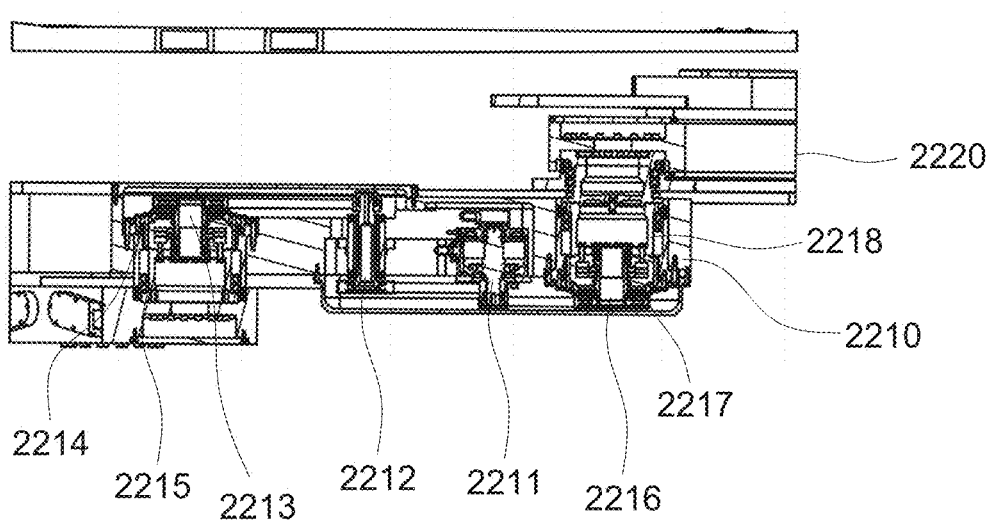
FIG. 10 is a drawing schematically illustrating a (3_1)-st transfer link arm of the substrate transfer robot to be combined with the travel robot in accordance with one example embodiment of the present disclosure.

Herein, by referring to FIG. 10, the (1_1)-st transfer link arm 2210 of the first transfer arm part 2200 may have a sealed inner space, and a first transfer driving motor 2211 and a third speed reducer 2212, interlocked with the first transfer driving motor 2211 to reduce a rotational speed of the first transfer driving motor 2211 by half, may be installed in the sealed inner space of the (1_1)-st transfer link arm 2210.

Also, a (3_1)-st drive shaft 2213, having a hollow formed therein and interlocked with the third speed reducer 2212, and a (3_1)-st output shaft 2214 interlocked with the (3_1)-st drive shaft 2213 may be sealingly installed on a (3_1)-st one-end area of the (1_1)-st transfer link arm 2210. Further, a (3_2)-nd drive shaft 2216, having a hollow formed therein and interlocked with the first transfer driving motor 2211, and a (3_2)-nd output shaft 2217 interlocked with the (3_2)-nd drive shaft 2216 may be sealingly installed on a (3_1)-st opposite-end area of the (1_1)-st transfer link arm 2210. Herein, the interlocking between the first transfer driving motor 2211 and the third speed reducer 2212, the interlocking between the third speed reducer 2212 and the (3_1)-st drive shaft 2213 and the interlocking between the first transfer driving motor 2211 and the (3_2)-nd drive shaft 2216 may be respectively achieved by using the pulley method, but the present disclosure is not limited thereto, and various methods, such as the gear method, etc., may be used for transmitting rotational force. Also, the (3_1)-st drive shaft 2213 and the (3_1)-st output shaft 2214, and the (3_2)-nd drive shaft 2216 and the (3_2)-nd output shaft 2217 may each be formed with a speed reducer having a same speed reduction ratio with each other. Adding to this, the (3_1)-st output shaft 2214 and the (3_2)-nd output shaft 2217 may rotate in opposite directions from each other.

Further, the (3_1)-st output shaft 2214 that is installed at the (3_1)-st one-end area of the (1_1)-st transfer link arm 2210 of the first transfer arm part 2200 may be inserted into the (2_2)-nd upper space of the (2_2)-nd coupling hole 2120 of the transfer arm platform 2100 so as to be fixedly engaged with the (2_2)-nd locking member.

Herein, a (2_1)-st linking member 2215 may be used for coupling the (3_1)-st output shaft 2214 and the (2_2)-nd locking member, wherein the (2_1)-st linking member 2215 may be a tube-shaped shaft having its length extended by a distance between the (3_1)-st output shaft 2214 and the (2_2)-nd locking member at a location where the transfer arm platform 2100 and the (1_1)-st transfer link arm 2210 are coupled, and both ends of the (2_1)-st linking member 2215 may be fixedly coupled with the (3_1)-st output shaft 2214 and the (2_2)-nd locking member respectively.

Also, the (3_2)-nd output shaft 2217 of the (1_1)-st transfer link arm 2210 of the first transfer arm part 2200 may be fixedly engaged with a (3_2)-nd one-end area of a (1_2)-nd transfer link arm 2220.

Herein, a first fixed coupling shaft 2218 may be used for coupling the (3_2)-nd output shaft 2217 and the (3_2)-nd one-end area, wherein the first fixed coupling shaft 2218 may be a tube-shaped shaft having its length extended by a distance between the (3_2)-nd output shaft 2217 and a coupling region of the (3_2)-nd one-end area to be connected to the (3_2)-nd output shaft 2217 at a location where the (1_1)-st transfer link arm 2210 and the (1_2)-nd transfer link arm 2220 are coupled, and both ends of the first fixed coupling shaft 2218 may be fixedly coupled with the (3_2)-nd output shaft 2217 and the coupling region of the (3_2)-nd one-end area respectively.

In addition, a first common link arm 2230 may be installed at a location where the (3_2)-nd output shaft 2217 and the (3_2)-nd one-end area are coupled.

Figure 11:
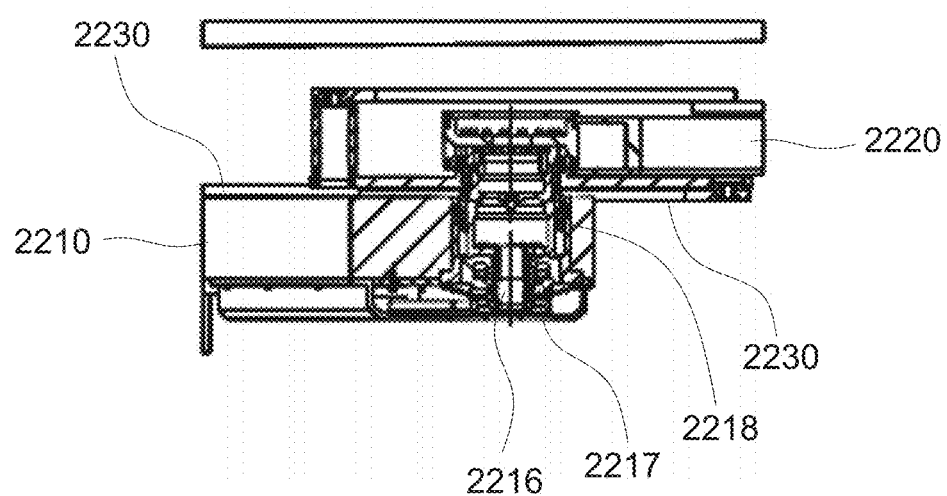
FIG. 11 is a drawing schematically illustrating a connecting part between the (3_1)-st transfer link arm and a (3_2)-nd transfer link arm of the substrate transfer robot to be combined with the travel robot in accordance with one example embodiment of the present disclosure.

That is, by referring to FIG. 11, a fourth center area of the first common link arm 2230 may be rotatably engaged with the first fixed coupling shaft 2218 that couples the (3_2)-nd output shaft 2217 and the (3_2)-nd one-end area.

Also, the first transfer arm part 2200 may include a (1_1)-st subordinate link arm 2240 that is in parallel with the (1_1)-st transfer link arm 2210, wherein a (3_4)-th one-end area of the (1_1)-st subordinate link arm 2240 may be rotatably engaged with the (1_1)-st blade 2191 of the link connecting member 2190 of the transfer arm platform 2100, and a (3_4)-th opposite-end area of the (1_1)-st subordinate link arm 2240 may be rotatably engaged with a (3_3)-rd one-end area of the first common link arm 2230.

Additionally, the first transfer arm part 2200 may include a (1_2)-nd subordinate link arm 2250 that is in parallel with the (1_2)-nd transfer link arm 2220, wherein a (3_5)-th one-end area of the (1_2)-nd subordinate link arm 2250 may be rotatably engaged with a (3_3)-rd opposite-end area of the first common link arm 2230.

Further, the first transfer arm part 2200 may include a (1_3)-rd subordinate link arm 2260 that is in parallel with the first common link arm 2230, wherein a (3_6)-th one-end area of the (1_3)-rd subordinate link arm 2260 may be rotatably engaged with a (3_5)-th opposite-end area of the (1_2)-nd subordinate link arm 2250, and a (3_6)-th opposite-end area of the (1_3)-rd subordinate link arm 2260 may be rotatably engaged with a (3_2)-nd opposite-end area of the (1_2)-nd transfer link arm 2220.

Also, the first transfer arm part 2200 may include the first end effector 2400, and the first end effector 2400 may be fixed to the (3_6)-th opposite-end area of the (1_3)-rd subordinate link arm 2260 to thereby support the substrate.

The first transfer arm part 2200 configured as above may make the first end effector 2400 move forward and backward along a straight line by each of the transfer arms and the subordinate arms according to an operation of the first transfer driving motor 2211. Accordingly, the substrate may be loaded or unloaded at a position set by the first end effector 2400.

Meanwhile, the second transfer arm part 2300 may be configured similarly as the first transfer arm part 2200, and the first transfer arm part 2200 and the second transfer arm part 2300 may be installed on the transfer arm platform 2100 so as to be symmetrical to each other with respect to a central region of the transfer arm platform 2100.

That is, the (2_1)-st transfer link arm 2310 of the second transfer arm part 2300 may have a sealed inner space, and a second transfer driving motor and a fourth speed reducer, interlocked with the second transfer driving motor to reduce a rotational speed of the second transfer driving motor by half, may be installed in the sealed inner space of the (2_1)-st transfer link arm 2310.

Also, a (4_1)-st drive shaft, having a hollow formed therein and interlocked with the fourth speed reducer, and a (4_1)-st output shaft interlocked with the (4_1)-st drive shaft may be sealingly installed on a (4_1)-st one-end area of the (2_1)-st transfer link arm 2310. Further, a (4_2)-nd drive shaft, having a hollow formed therein and interlocked with the second transfer driving motor, and a (4_2)-nd output shaft interlocked with the (4_2)-nd drive shaft may be sealingly installed on a (4_1)-st opposite-end area of the (2_1)-st transfer link arm 2310. Herein, the interlocking between the second transfer driving motor and the fourth speed reducer, the interlocking between the fourth speed reducer and the (4_1)-st drive shaft and the interlocking between the second transfer driving motor and the (4_2)-nd drive shaft may be respectively achieved by using the pulley method, but the present disclosure is not limited thereto, and various methods, such as the gear method, etc., may be used for transmitting rotational force. Also, the (4_1)-st drive shaft and the (4_1)-st output shaft, and the (4_2)-nd drive shaft and the (4_2)-nd output shaft may each be formed with a speed reducer having a same speed reduction ratio with each other. Adding to this, the (4_1)-st output shaft and the (4_2)-nd output shaft may rotate in opposite directions from each other.

Further, the (4_1)-st output shaft that is installed at the (4_1)-st one-end area of the (2_1)-st transfer link arm 2310 of the second transfer arm part 2300 may be inserted into the (2_3)-rd upper space of the (2_3)-rd coupling hole 2130 of the transfer arm platform 2100 so as to be fixedly engaged with the (2_3)-rd locking member.

Herein, a (2_2)-nd linking member may be used for coupling the (4_1)-st output shaft and the (2_3)-rd locking member, wherein the (2_2)-nd linking member may be a tube-shaped shaft having its length extended by a distance between the (4_1)-st output shaft and the (2_3)-rd locking member at a location where the transfer arm platform 2100 and the (2_1)-st transfer link arm 2310 are coupled, and both ends of the (2_2)-nd linking member may be fixedly coupled with the (4_1)-st output shaft and the (2_3)-rd locking member respectively.

Also, the (4_2)-nd output shaft of the (2_1)-st transfer link arm 2310 of the second transfer arm part 2300 may be fixedly engaged with a (4_2)-nd one-end area of a (2_2)-nd transfer link arm 2320.

Herein, a second fixed coupling shaft may be used for coupling the (4_2)-nd output shaft and the (4_2)-nd one-end area, wherein the second fixed coupling part may be a tube-shaped shaft having its length extended by a distance between the (4_2)-nd output shaft and a coupling region of the (4_2)-nd one-end area to be connected to the (4_2)-nd output shaft at a location where the (2_1)-st transfer link arm 2310 and the (2_2)-nd transfer link arm 2320 are coupled, and both ends of the second fixed coupling shaft may be fixedly coupled with the (4_2)-nd output shaft and the coupling region of the (4_2)-nd one-end area respectively.

In addition, a second common link arm 2330 may be installed at a location where the (4_2)-nd output shaft and the (4_2)-nd one-end area are coupled.

That is, a fifth center area of the second common link arm 2330 may be rotatably engaged with the second fixed coupling shaft that couples the (4_2)-nd output shaft and the (4_2)-nd one-end area.

Also, the second transfer arm part 2300 may include a (2_1)-st subordinate link arm 2340 that is in parallel with the (2_1)-st transfer link arm 2310, wherein a (4_4)-th one-end area of the (2_1)-st subordinate link arm 2340 may be rotatably engaged with the (1_2)-nd blade 2192 of the link connecting member 2190 of the transfer arm platform 2100, and a (4_4)-th opposite-end area of the (2_1)-st subordinate link arm 2340 may be rotatably engaged with a (4_3)-rd one-end area of the second common link arm 2330.

Additionally, the second transfer arm part 2300 may include a (2_2)-nd subordinate link arm 2350 that is in parallel with the (2_2)-nd transfer link arm 2320, wherein a (4_5)-th one-end area of the (2_2)-nd subordinate link arm 2350 may be rotatably engaged with a (4_3)-rd opposite-end area of the second common link arm 2330.

Further, the second transfer arm part 2300 may include a (2_3)-rd subordinate link arm 2360 that is in parallel with the second common link arm 2330, wherein a (4_6)-th one-end area of the (2_3)-rd subordinate link arm 2360 may be rotatably engaged with a (4_5)-th opposite-end area of the (2_2)-nd subordinate link arm 2350, and a (4_6)-th opposite-end area of the (2_3)-rd subordinate link arm 2360 may be rotatably engaged with a (4_2)-nd opposite-end area of the (2_2)-nd transfer link arm 2320.

Also, the second transfer arm part 2300 may include the second end effector 2500, and the second end effector 2500 may be fixed to the (4_6)-th opposite-end area of the (2_3)-rd subordinate link arm 2360 to thereby support the substrate.

The second transfer arm part 2300 configured as above may make the second end effector 2500 move forward and backward along a straight line by each of the transfer arms and the subordinate arms according to an operation of the second transfer driving motor. Accordingly, the substrate may be loaded or unloaded at a position set by the second end effector 2500.

Herein, the (3_1)-st opposite-end area of the (1_1)-st transfer link arm 2210 of the first transfer arm part 2200 and the (4_1)-st opposite-end area of the (2_1)-st transfer link arm 2310 of the second transfer arm part 2300 may be identically located at the front area or a rear area of the transfer arm platform 2100.

Also, unlike this, the (3_1)-st opposite-end area of the (1_1)-st transfer link arm 2210 of the first transfer arm part 2200 may be located at the front area of the transfer arm platform 2100, while the (4_1)-st opposite-end area of the (2_1)-st transfer link arm 2310 of the second transfer arm part 2300 may be located at the rear area of the transfer arm platform 2100.

In addition, a height of the second fixed coupling shaft, coupling the (2_1)-st transfer link arm 2310 of the second transfer arm part 2300 and the (2_2)-nd transfer link arm 2320 of the second transfer arm part 2300, may be set as higher than a height of the first fixed coupling shaft 2218, coupling the (1_1)-st transfer link arm 2210 of the first transfer arm part 2200 and the (1_2)-nd transfer link arm 2220 of the first transfer arm part 2200, such that the first end effector 2400 of the first transfer arm part 2200 and the second end effector 2500 of the second transfer arm part 2300 may be positioned at different heights during operations of the first end effector 2400 and the second end effector 2500.

Further, the second common link arm 2330 that couples the (2_1)-st transfer link arm 2310 of the second transfer arm part 2300 and the (2_2)-nd transfer link arm 2320 of the second transfer arm part 2300 may include a hollow tube, corresponding to the height of the second fixed coupling shaft and having a hollow formed therein for inserting the second fixed coupling shaft therein. Herein, a (2_1)-st blade including the (4_3)-rd one-end area may be fixedly coupled with a lower area of the hollow tube and a (2_2)-nd blade including the (4_3)-rd opposite-end area may be fixedly coupled with an upper area of the hollow tube. Also, the (4_3)-rd one-end area and the (4_3)-rd opposite-end area with respect to a central axis of the hollow tube may lie symmetrically on each side of the central axis of the hollow tube when viewed from the central axis of the hollow tube.

In addition, a third wiring for an operation of the first transfer driving motor 2211 and a fourth wiring for an operation of the second transfer driving motor may be respectively disposed in an enclosed space inside the substrate transfer robot 2000.

Herein, the third wiring may be fed into the first transfer driving motor 2211 through the hollow of the elevating drive shaft 101 of the elevating part 100, the hollow of the (1_1)-st drive shaft 233 of the travel robot 1000, the hollow of the (1_2)-nd drive shaft 236 of the travel robot 1000, the hollow of the rotation drive shaft 281 of the travel robot 1000 and the hollow of the (3_1)-st drive shaft 2213 of the substrate transfer robot 2000 so as to prevent the third wiring from being exposed to the inner space of the vacuum chamber. Also, the fourth wiring may be fed into the second transfer driving motor through the hollow of the elevating drive shaft 101 of the elevating part 100, the hollow of the (2_1)-st drive shaft of the travel robot 1000, the hollow of the (2_2)-nd drive shaft of the travel robot 1000, the hollow of the rotation drive shaft 281 of the travel robot 1000 and the hollow of the (4_1)-st drive shaft of the substrate transfer robot 2000 so as to prevent the fourth wiring from being exposed to the inner space of the vacuum chamber. Meanwhile, the third wiring and the fourth wiring may be respectively branched from the rotation drive shaft 281 into the first transfer arm part 2200 and the second transfer arm part 2300 through a wiring hole formed at the transfer arm platform 2100.

In the configuration explained above, the height of the second fixed coupling shaft, coupling the (2_1)-st transfer link arm 2310 of the second transfer arm part 2300 and the (2_2)-nd transfer link arm 2320 of the second transfer arm part 2300, is set as higher than the height of the first fixed coupling shaft 2218, coupling the (1_1)-st transfer link arm 2210 of the first transfer arm part 2200 and the (1_2)-nd transfer link arm 2220 of the first transfer arm part 2200, such that the first end effector 2400 of the first transfer arm part 2200 and the second end effector 2500 of the second transfer arm part 2300 are positioned at different heights during the operations of the first end effector 2400 and the second end effector 2500. In this way, the first transfer arm part 2200 may operate as a lower transfer arm and the second transfer arm part 2300 may operate as an upper transfer arm, but on the contrary to this, it may also be possible according to another example embodiment of the present disclosure that the height of the first fixed coupling shaft 2218 of the first transfer arm part 2200 and the height of the second fixed coupling shift of the second transfer arm part 2300 may be set as same with each other so that the first transfer arm part 2200 and the second transfer arm part 2300 have a same height.

In other words, the first transfer arm part 2200 and the second transfer arm part 2300 may be formed in a same shape, but to be symmetrical with other, so that installation heights of the first transfer arm part 2200 and the second transfer arm part 2300 become lowered.

In addition, since the installation heights of the first transfer arm part 2200 and the second transfer arm part 2300 can be lowered, a height of a transfer chamber in which the substrate transfer robot is located can also be lowered as a result. Also, lowering the height of the transfer chamber can reduce an inner space of the transfer chamber, and thus may also be possible to improve a vacuum performance of the transfer chamber.

Figure 12:
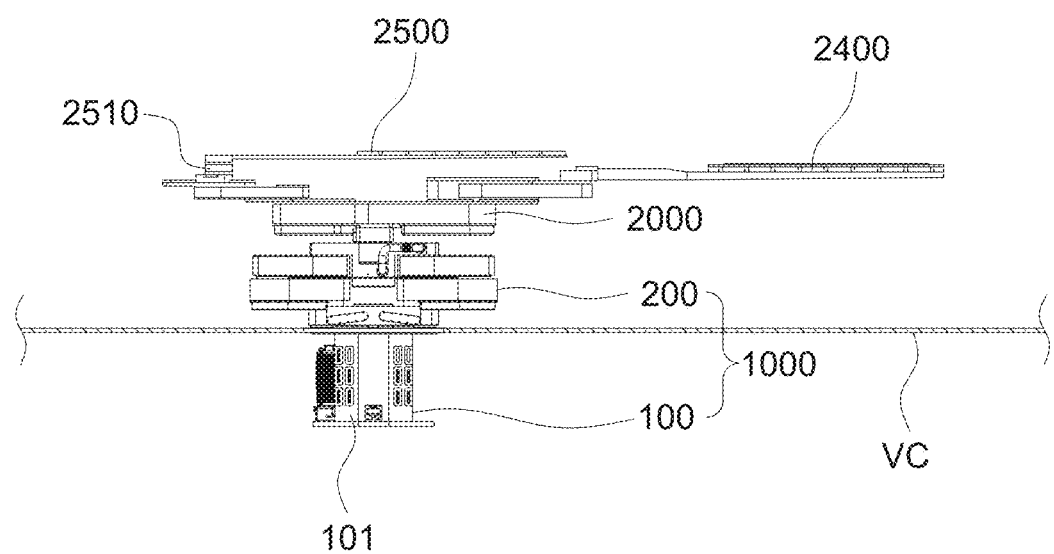
FIG. 12 to FIG. 14 are drawings schematically illustrating a substrate transfer robot to be combined with the travel robot in accordance with another example embodiment of the present disclosure.
Figure 13:
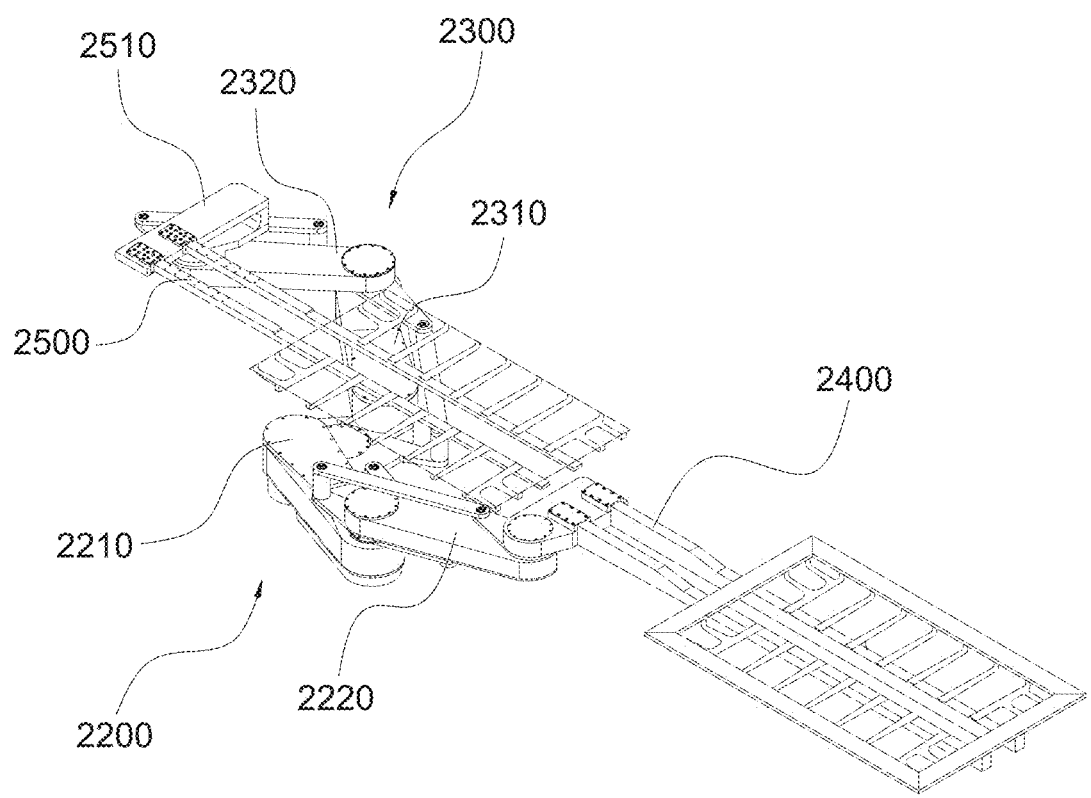
Figure 14:
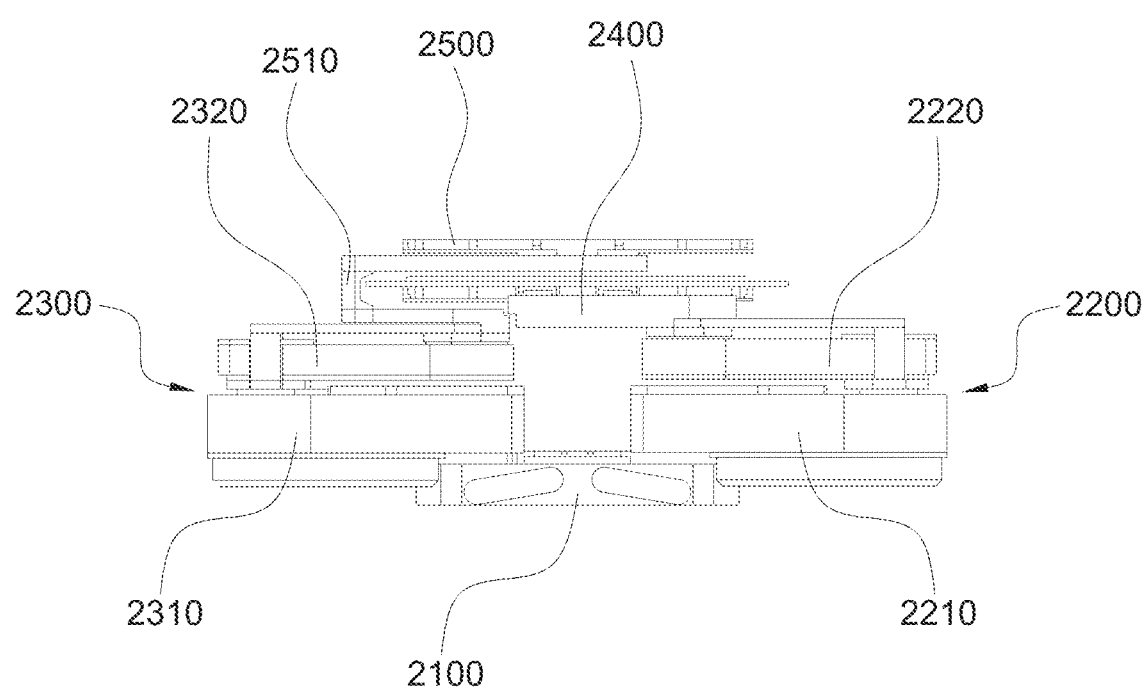

This is described in more detail with reference to FIG. 12 to FIG. 14 as follows. For convenience of understanding, same reference numerals as FIG. 1 to FIG. 11 are applied to FIG. 12 to FIG. 14 for identical parts. In the following description, detailed explanation of parts that can be easily understood from the description provided by referring to FIG. 1 to FIG. 11 are omitted.

The (1_2)-nd transfer link arm 2220 of the first transfer arm part 2200 may be fixedly engaged with the (3_2)-nd output shaft of the (1_1)-st transfer link arm 2210 of the first transfer arm part 2200 through the first fixed coupling shaft. Also, the (2_2)-nd transfer link arm 2320 of the second transfer arm part 2300 may be fixedly engaged with the (4_2)-nd output shaft of the (2_1)-st transfer link arm 2310 of the second transfer arm part 2300 through the second fixed coupling shaft.

Herein, by forming the first fixed coupling shaft and the second fixed coupling shaft to have a same height, installation heights of the (1_2)-nd transfer link arm 2220 of the first transfer arm part 2200 and the (2_2)-nd transfer link arm 2320 of the second transfer arm part 2300 may be formed to have a same height.

That is, the (1_1)-st transfer link arm 2210 and the (1_2)-nd transfer link arm 2220 of the first transfer arm part 2200 and the (2_1)-st transfer link arm 2310 and the (2_2)-nd transfer link arm 2320 of the second transfer arm part 2300 may be installed at a same height and be formed symmetrical to each other.

Also, while the first end effector 2400 of the first transfer arm part 2200 is fixedly engaged with the (3_6)-th opposite-end area of the (1_3)-rd subordinate link arm, the second end effector 2500 of the second transfer arm part 2300 may be fixedly engaged with the (4_6)-th opposite end area of the (2_3)-rd subordinate link arm through a bracket 2510 so that the second end effector 2500 is at a different height from the first end effector 2400. Herein, the bracket 2510 may be formed in a "ㄷ" shape, but the present disclosure is not limited thereto. For reference, "ㄷ" is a Korean alphabet.

Accordingly, the first end effector 2400 of the first transfer arm 2200 and the second end effector 2500 of the second transfer arm 2300 may be separated by a distance between an upper surface and a lower surface of the bracket 2510, and thus support the substrates at different heights.

Also, when the substrates are being transferred by the operations of the first transfer arm part 2200 and the second transfer arm part 2300, the first end effector 2400 or the substrate supported by the first end effector 2400 may be moved through a space in-between the upper surface and the lower surface of the bracket 2510 to thereby prevent any interference between the first end effector 2400 and the second end effector 2500.

Meanwhile, although a characteristic configuration of the substrate transfer robot supported by the travel robot 1000 is been described above, the present disclosure is not limited to the configuration of the substrate transfer robot described above, and all types of substrate transfer robots that transfer substrates inside the vacuum chamber may be coupled with the travel robot, so as to perform the traveling of the substrate transfer robot inside the vacuum chamber by the travel robot and the substrate transfer inside the vacuum chamber by the substrate transfer robot.

In addition, although the transfer of the substrate has been described above, the present disclosure may also be applied to a transfer of masks necessary for processing the substrates.

The present disclosure has an effect of installing the travel robot in the vacuum chamber to thereby enable the moving of the substrate transfer robot that transfers the substrate within the vacuum chamber.

The present disclosure has another effect of facilitating easy installation of the travel robot in the vacuum chamber without having to install a separate structure for creating a transport path by building the travel robot in a link arm structure.

The present disclosure has still another effect of facilitating easy maintenance of the travel robot by installing the travel robot that is built of the link arm structure instead of installing the separate structure for creating the transport path.

The present disclosure has still yet another effect of forming a driving unit of the travel robot in a sealed structure and forming wiring required for the operation of the driving unit inside the travel robot so that possible pollution sources are blocked in advance and a vacuum state of the vacuum chamber is maintained.

As seen above, the present disclosure has been explained by specific matters such as detailed components, limited embodiments, and drawings. While the invention has been shown and described with respect to the preferred embodiments, it, however, will be understood by those skilled in the art that various changes and modification may be made without departing from the spirit and scope of the invention as defined in the following claims.

Accordingly, the thought of the present disclosure must not be confined to the explained embodiments, and the following patent claims as well as everything including variations equal or equivalent to the patent claims pertain to the category of the thought of the present disclosure.

What is claimed is:

1. A travel robot for moving a substrate transfer robot in a vacuum chamber, comprising:
   a travel arm platform through which a (1_1)-st coupling hole, a (1_2)-nd coupling hole and a (1_3)-rd coupling hole are formed respectively at a first center area, a first one-end area and a first opposite-end area thereof, wherein a (1_1)-st locking member, through which a (1_1)-st through-hole corresponding to a hollow of an elevating drive shaft is formed, compartmentalizes the (1_1)-st coupling hole into a (1_1)-st upper space sealed by a (1_1)-st cover and a (1_1)-st lower space, wherein a (1_2)-nd locking member, through which a (1_2)-nd through-hole is formed, compartmentalizes the (1_2)-nd coupling hole into a (1_2)-nd upper space and a (1_2)-nd lower space sealed by a (1_2)-nd cover, wherein a (1_3)-rd locking member, through which a (1_3)-rd through-hole is formed, compartmentalizes the (1_3)-rd coupling hole into a (1_3)-rd upper space and a (1_3)-rd lower space sealed by a (1_3)-rd cover, and wherein the elevating drive shaft inserted into the (1_1)-st lower space is fixedly engaged with the (1_1)-st locking member;
   a first travel arm part including a (1_1)-st travel link arm and a (1_2)-nd travel link arm, wherein a first travel driving motor and a first speed reducer, interlocked with the first travel driving motor to reduce a rotational speed of the first travel driving motor by half, are installed in a sealed inner space of the (1_1)-st travel link arm, wherein a (1_1)-st drive shaft, having a hollow formed therein and interlocked with the first speed reducer, and a (1_1)-st output shaft interlocked with the (1_1)-st drive shaft are sealingly installed on a (1_1)-st one-end area of the (1_1)-st travel link arm, wherein a (1_2)-nd drive shaft, having a hollow formed therein and interlocked with the first travel driving motor, and a (1_2)-nd output shaft interlocked with the (1_2)-nd drive shaft are sealingly installed on a (1_1)-st opposite-end area of the (1_1)-st travel link arm, wherein the (1_1)-st output shaft of the (1_1)-st travel link arm is fixedly engaged with a (1_1)-st linking member that is inserted into the (1_2)-nd upper space of the travel arm platform to be fixedly engaged with the (1_2)-nd locking member, and wherein a (1_2)-nd one-end area of the (1_2)-nd travel link arm is fixedly engaged with the (1_2)-nd output shaft of the (1_1)-st travel link arm;
   a second travel arm part including a (2_1)-st travel link arm and a (2_2)-nd travel link arm, wherein a second travel driving motor and a second speed reducer, interlocked with the second travel driving motor to reduce a rotational speed of the second travel driving motor by half, are installed in a sealed inner space of the (2_1)-st travel link arm, wherein a (2_1)-st drive shaft, having a hollow formed therein and interlocked with the second speed reducer, and a (2_1)-st output shaft interlocked with the (2_1)-st drive shaft are sealingly installed on a (2_1)-st one-end area of the (2_1)-st travel link arm, wherein a (2_2)-nd drive shaft, having a hollow formed therein and interlocked with the second travel driving motor, and a (2_2)-nd output shaft interlocked with the (2_2)-nd drive shaft are sealingly installed on a (2_1)-st opposite-end area of the (2_1)-st travel link arm, wherein the (2_1)-st output shaft of the (2_1)-st travel link arm is fixedly engaged with a (1_2)-nd linking member that is inserted into the (1_3)-rd upper space of the travel arm platform to be fixedly engaged with the (1_3)-rd locking member, and wherein a (2_2)-nd one-end area of the (2_2)-nd travel link arm is fixedly engaged with the (2_2)-nd output shaft of the (2_1)-st travel link arm; and a transfer robot coupling part whose second one-end area is rotatably engaged with a (1_2)-nd opposite-end area of the (1_2)-nd travel link arm, whose second opposite-end area is rotatably engaged with a (2_2)-nd opposite-end area of the (2_2)-nd travel link arm, and whose second center area has a rotation driving motor built thereon, wherein the rotation driving motor is sealingly engaged with the substrate transfer robot, for transferring a substrate, by a rotation drive shaft having a hollow formed therein.

2. The travel robot of claim 1, wherein the transfer robot coupling part further includes a compliance part formed at one of the second one-end area and the second opposite-end area, wherein the compliance part changes, within the transfer robot coupling part, one of a position at which the (1_2)-nd opposite-end area of the (1_2)-nd travel link arm is rotatably engaged and a position at which the (2_2)-nd opposite-end area of the (2_2)-nd travel link arm is rotatably engaged, in response to an external force exerted.

3. The travel robot of claim 2, wherein the compliance part includes: a sliding member that slides in a longitudinal direction of the transfer robot coupling part within one of the second one-end area and the second opposite-end area, and is rotatably engaged with one of the (1_2)-nd opposite-end area of the (1_2)-nd travel link arm and the (2_2)-nd opposite-end area of the (2_2)-nd travel link arm; and elastic members each of which is formed on each of sliding paths located on both sides of the sliding member inside one of the second one-end area and the second opposite-end area.

4. The travel robot of claim 1, wherein the travel arm platform further includes: a first wiring hole bridging the (1_1)-st upper space and the (1_2)-nd lower space; and a second wiring hole bridging the (1_1)-st upper space and the (1_3)-rd lower space.

5. The travel robot of claim 1, wherein the travel arm platform further includes: a (1_1)-st wiring hole and a (1_2)-nd wiring hole, each bridging the (1_1)-st upper space and one side of a body of the travel arm platform; a (2_1)-st wiring hole, bridging the (1_2)-nd lower space and the one side of the body of the travel arm platform; a (2_2)-nd wiring hole, bridging the (1_3)-rd lower space and the one side of the body of the travel arm platform; a first sealing cover, sealing the (1_1)-st wiring hole and the (2_1)-st wiring hole at the one side of the body of the travel arm platform; and a second sealing cover, sealing the (1_2)-nd wiring hole and the (2_2)-nd wiring hole at the one side of the body of the travel arm platform.

6. The travel robot of claim 1, further comprising: a first wiring for an operation of the first travel driving motor; and a second wiring for an operation of the second travel driving motor, wherein the first wiring is fed into the first travel driving motor through the hollow of the elevating drive shaft and the hollow of the (1_1)-st drive shaft so as to prevent the first wiring from being exposed to an inner space of the vacuum chamber, and wherein the second wiring is fed into the second travel driving motor through the hollow of the elevating drive shaft and the hollow of (2_1)-st drive shaft so as to prevent the second wiring from being exposed to the inner space of the vacuum chamber.

7. The travel robot of claim 1, wherein the travel robot is provided with a (1_1)-st intersection point, a (1_2)-nd intersection point, a (2_1)-st intersection point, a (2_2)-nd intersection point, a (3_1)-st intersection point and a (3_2)-nd intersection point, wherein the (1_1)-st intersection point is a point at which a longitudinal center line of the travel arm platform and a longitudinal center line of the (1_1)-st travel link arm intersect, wherein the (1_2)-nd intersection point is a point at which the longitudinal center line of the travel arm platform and a longitudinal center line of the (2_1)-st travel link arm intersect, wherein the (2_1)-st intersection point is a point at which the longitudinal center line of the (1_1)-st travel link arm and a longitudinal center line of a (1_2)-nd travel link arm intersect, wherein the (2_2)-nd intersection point is a point at which the longitudinal center line of the (2_1)-st travel link arm and a longitudinal center line of the (2_2)-nd travel link arm intersect, wherein the (3_1)-st intersection point is a point at which the longitudinal center line of the (1_2)-nd travel link arm and a longitudinal center line of the transfer robot coupling part intersect, and wherein the (3_2)-nd intersection point is a point at which the longitudinal center line of the (2_2)-nd travel link arm and the longitudinal center line of the transfer robot coupling part intersect, wherein a distance between the (1_1)-st intersection point and the (1_2)-nd intersection point and a distance between the (3_1)-st intersection point and the (3_2)-nd intersection point are determined as same with each other, and a distance between the (1_1)-st intersection point and the (2_1)-st intersection point, a distance between the (2_1)-st intersection point and the (3_1)-st intersection point, a distance between the (1_2)-nd intersection point and the (2_2)-nd intersection point and a distance between the (2_2)-nd intersection point and the (3_2)-nd intersection point are determined as same with each other, and wherein an absolute value of an angle formed between the travel arm platform and the (1_1)-st travel link arm at the (1_1)-st intersection point is determined as same with an absolute value of an angle formed between the travel arm platform and the (2_1)-st travel link arm at the (1_2)-nd intersection point, an absolute value of an angle formed between the (1_1)-st travel link arm and the (1_2)-nd travel link arm at the (2_1)-st intersection point is determined as same with an absolute value of an angle formed between the (2_1)-st travel link arm and the (2_2)-nd travel link arm at the (2_2)-nd intersection point, and an absolute value of an angle formed between the (1_2)-nd travel link arm and the transfer robot coupling part at the (3_1)-st intersection point is determined as same with an absolute value of an angle formed between the (2_2)-nd travel link arm and the transfer robot coupling part at the (3_2)-nd intersection point.

8. The travel robot of claim 1, wherein the first travel driving motor and the second travel driving motor operate in an identical manner, but rotate in opposite directions from each other.

9. The travel robot of claim 1, wherein the substrate transfer robot includes:

a transfer arm platform through which a (2_1)-st coupling hole, a (2-2)-nd coupling hole and a (2_3)-rd coupling hole are formed respectively at a third center area, a third one-end area and a third opposite-end area thereof, wherein a (2_1)-st locking member, through which a (2_1)-st through-hole corresponding to the hollow of the rotation drive shaft of the rotation driving motor of the transfer robot coupling part is formed, compartmentalizes the (2_1)-st coupling hole into a (2_1)-st upper space sealed by a (2_1)-st cover and a (2_1)-st lower space, wherein a (2_2)-nd locking member, through which a (2_2)-nd through-hole is formed, compartmentalizes the (2_2)-nd coupling hole into a (2_2)-nd upper space and a (2_2)-nd lower space sealed by a (2_2)-nd cover, wherein a (2_3)-rd locking member, through which a (2_3)-rd through-hole is formed, compartmentalizes the (2_3)-rd coupling hole into a (2_3)-rd upper space and a (2_3)-rd lower space sealed by a (2_3)-rd cover, wherein a link connecting member including a (1_1)-st blade and a (1_2)-nd blade for link connection is fixedly engaged at a front area, with a direction of the front area being a direction of a processing chamber from the substrate transfer robot when the substrate transfer robot is positioned to transfer a substrate to the processing chamber coupled with the vacuum chamber, and wherein the rotation drive shaft of the rotation driving motor inserted into the (2_1)-st lower space is fixedly engaged with the (2_1)-st locking member;

a first transfer arm part including a (1_1)-st transfer link arm, a (1_2)-nd transfer link arm, a first common link arm, a (1_1)-st subordinate link arm parallel to the (1_1)-st transfer link arm, a (1_2)-nd subordinate link arm parallel to the (1_2)-nd transfer link arm, a (1_3)-rd subordinate link arm parallel to the first common link arm, and a first end effector, wherein a first transfer driving motor and a third speed reducer, interlocked with the first transfer driving motor to reduce a rotational speed of the first transfer driving motor by half, are installed in a sealed inner space of the (1_1)-st transfer link arm, wherein a (3_1)-st drive shaft, having a hollow formed therein and interlocked with the third speed reducer, and a (3_1)-st output shaft interlocked with the (3_1)-st drive shaft are sealingly installed on a (3_1)-st one-end area of the (1_1)-st transfer link arm, wherein a (3_2)-nd drive shaft, having a hollow formed therein and interlocked with the first transfer driving motor, and a (3_2)-nd output shaft interlocked with the (3_2)-nd drive shaft are sealingly installed on a (3_1)-st opposite-end area of the (1_1)-st transfer link arm, wherein the (3_1)-st output shaft of the (1_1)-st transfer link arm is fixedly engaged with a (2_1)-st linking member that is inserted into the (2_2)-nd upper space of the transfer arm platform to be fixedly engaged with the (2_2)-nd locking member, wherein a (3_2)-nd one-end area of the (1_2)-nd transfer link arm is fixedly engaged with the (3-2)-nd output shaft of the (1_1)-st transfer link arm through a first fixed coupling shaft, wherein a fourth center area of the first common link arm is rotatably engaged with the first fixed coupling shaft, wherein a (3_4)-th one-end area of the (1_1)-st subordinate link arm is rotatably engaged with the (1_1)-st blade of the link connecting member of the transfer arm platform, and a (3_4)-th opposite-end area of the (1_1)-st subordinate link arm is rotatably engaged with a (3_3)-rd one-end area of the first common link arm, wherein a (3_5)-th one-end area of the (1_2)-nd subordinate link arm is rotatably engaged with a (3_3)-rd opposite-end area of the first common link arm, wherein a (3_6)-th one-end area of the (1_3)-rd subordinate link arm is rotatably engaged with a (3_5)-th opposite-end area of the (1_2)-nd subordinate link arm, and a (3_6)-th opposite-end area of the (1_3)-rd subordinate link arm is rotatably engaged with a (3_2)-nd opposite-end area of the (1_2)-nd transfer link arm, and wherein the first end effector is fixed to the (3_6)-th opposite-end area of the (1_3)-rd subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_2)-nd transfer link arm, a (2_3)-rd subordinate link arm parallel to the second common link arm, and a second end effector, wherein a second transfer driving motor and a fourth speed reducer, interlocked with the second transfer driving motor to reduce a rotational speed of the second transfer driving motor by half, are installed in a sealed inner space of the (2_1)-st transfer link arm, wherein a (4_1)-st drive shaft, having a hollow formed therein and interlocked with the fourth speed reducer, and a (4_1)-st output shaft interlocked with the (4_1)-st drive shaft are sealingly installed on a (4_1)-st one-end area of the (2_1)-st transfer link arm, wherein a (4_2)-nd drive shaft, having a hollow formed therein and interlocked with the second transfer driving motor, and a (4_2)-nd output shaft interlocked with the (4_2)-nd drive shaft are sealingly installed on a (4_1)-st opposite-end area of the (2_1)-st transfer link arm, wherein the (4_1)-st output shaft of the (2_1)-st transfer link arm is fixedly engaged with a (2_2)-nd linking member that is inserted into the (2_3)-rd upper space of the transfer arm platform to be fixedly engaged with the (2_3)-rd locking member, wherein a (4_2)-nd one-end area of the (2_2)-nd transfer link arm is fixedly engaged with the (4-2)-nd output shaft of the (2_1)-st transfer link arm through a second fixed coupling shaft, wherein a fifth center area of the second common link arm is rotatably engaged with the second fixed coupling shaft, wherein a (4_4)-th one-end area of the (2_1)-st subordinate link arm is rotatably engaged with the (1_2)-nd blade of the link connecting member of the transfer arm platform, and a (4_4)-th opposite-end area of the (2_1)-st subordinate link arm is rotatably engaged with a (4_3)-rd one-end area of the second common link arm, wherein a (4_5)-th one-end area of the (2_2)-nd subordinate link arm is rotatably engaged with a (4_3)-rd opposite-end area of the second common link arm, wherein a (4_6)-th one-end area of the (2_3)-rd subordinate link arm is rotatably engaged with a (4_5)-th opposite-end area of the (2_2)-nd subordinate link arm, and a (4_6)-th opposite-end area of the (2_3)-rd subordinate link arm is rotatably engaged with a (4_2)-nd opposite-end area of the (2_2)-nd transfer link arm, and wherein the second end effector is fixedly engaged with the (4_6)-th opposite-end area of the (2_3)-rd subordinate link arm through a bracket to thereby support the substrate.

10. The travel robot of claim 9, wherein the (3_1)-st opposite-end area of the (1_1)-st transfer link arm of the first transfer arm part is located at the front area of the transfer arm platform, and the (4_1)-st opposite-end area of the (2_1)-st transfer link arm of the second transfer arm part is located at a rear area of the transfer arm platform.

11. The travel robot of claim 9, wherein the transfer arm platform further includes: a third wiring hole bridging the (2_1)-st upper space and the (2_2)-nd lower space; and a fourth wiring hole bridging the (2_1)-st upper space and the (2_3)-rd lower space.

12. The travel robot of claim 9, wherein the transfer arm platform further includes: a (3_1)-st wiring hole and a (3_2)-nd wiring hole, each bridging the (2_1)-st upper space and one side of a body of the transfer arm platform; a (4_1)-st wiring hole, bridging the (2_2)-nd lower space and the one side of the body of the transfer arm platform; a (4_2)-nd wiring hole, bridging the (2_3)-rd lower space and the one side of the body of the transfer arm platform; a third sealing cover, sealing the (3_1)-st wiring hole and the (4_1)-st wiring hole at the one side of the body of the transfer arm platform; and a fourth sealing cover, sealing the (3_2)-nd wiring hole and the (4_2)-nd wiring hole at the one side of the body of the transfer arm platform.

13. The travel robot of claim 9, wherein the substrate transfer robot further includes: a third wiring for an operation of the first transfer driving motor; and a fourth wiring for an operation of the second transfer driving motor, wherein the third wiring is fed into the first transfer driving motor through the hollow of the elevating drive shaft, the hollow of the (1_1)-st drive shaft, the hollow of the (1_2)-nd drive shaft, the hollow of the rotation drive shaft and the hollow of the (3_1)-st drive shaft so as to prevent the third wiring from being exposed to an inner space of the vacuum chamber, and wherein the fourth wiring is fed into the second transfer driving motor through the hollow of the elevating drive shaft, the hollow of the (2_1)-st drive shaft, the hollow of the (2_2)-nd drive shaft, the hollow of the rotation drive shaft and the hollow of the (4_1)-st drive shaft so as to prevent the fourth wiring from being exposed to the inner space of the vacuum chamber.

* * * * *